(12) United States Patent
Naito

(10) Patent No.: US 10,797,045 B2
(45) Date of Patent: Oct. 6, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 24 days.

(21) Appl. No.: 16/200,583

(22) Filed: Nov. 26, 2018

(65) Prior Publication Data

US 2019/0109131 A1    Apr. 11, 2019

Related U.S. Application Data

(63) Continuation of application No. PCT/JP2017/044252, filed on Dec. 8, 2017.

(30) Foreign Application Priority Data

Dec. 8, 2016  (JP) .................................. 2016-238469
Jun. 5, 2017  (JP) .................................. 2017-111107

(51) Int. Cl.
*H01L 27/06*    (2006.01)
*H01L 21/324*   (2006.01)
(Continued)

(52) U.S. Cl.
CPC ........ *H01L 27/0664* (2013.01); *H01L 21/266* (2013.01); *H01L 21/26513* (2013.01);
(Continued)

(58) Field of Classification Search
CPC . H01L 27/0664; H01L 29/06; H01L 29/7395; H01L 27/0727; H01L 29/7397;
(Continued)

(56) References Cited

U.S. PATENT DOCUMENTS

2007/0114598 A1   5/2007  Hotta
2007/0267663 A1   11/2007 Harada
(Continued)

FOREIGN PATENT DOCUMENTS

JP    2005210047 A    8/2005
JP    2007266134 A    10/2007
(Continued)

OTHER PUBLICATIONS

International Search Report for International Patent Application No. PCT/JP20171044252, issued by the Japan Patent Office dated Feb. 6, 2018.

*Primary Examiner* — Mohammed R Alam

(57) ABSTRACT

An accumulation layer has a function of reducing an ON voltage (Von), which is a voltage between the collector and the emitter when turning on the IGBT, by accumulating carrier. However, when turning off the IGBT, the carrier contributes to a turn-off loss (Eoff). A semiconductor device is provided, comprising: a semiconductor substrate, wherein the semiconductor substrate includes: trench portions, a mesa portion each provided between two adjacent trench portions, and a drift layer, wherein the trench portions include: a gate trench portion, and a dummy trench portion, wherein the mesa portion has: an emitter region, a contact region, and a accumulation layer, wherein the number of accumulation layers provided in a depth direction in the mesa portion adjacent to the gate trench portion is larger than that of the accumulation layers provided in the depth direction in the mesa portion between the two dummy trench portions.

9 Claims, 23 Drawing Sheets

(51) Int. Cl.

| | | |
|---|---|---|
| *H01L 29/861* | (2006.01) | |
| *H01L 29/06* | (2006.01) | |
| *H01L 29/10* | (2006.01) | |
| *H01L 29/40* | (2006.01) | |
| *H01L 29/08* | (2006.01) | |
| *H01L 29/66* | (2006.01) | |
| *H01L 21/265* | (2006.01) | |
| *H01L 21/266* | (2006.01) | |
| *H01L 29/739* | (2006.01) | |
| *H01L 27/07* | (2006.01) | |
| *H01L 21/322* | (2006.01) | |
| *H01L 29/12* | (2006.01) | |

(52) U.S. Cl.
CPC .......... *H01L 21/322* (2013.01); *H01L 21/324* (2013.01); *H01L 27/0727* (2013.01); *H01L 29/06* (2013.01); *H01L 29/0619* (2013.01); *H01L 29/0634* (2013.01); *H01L 29/0638* (2013.01); *H01L 29/0696* (2013.01); *H01L 29/0834* (2013.01); *H01L 29/1095* (2013.01); *H01L 29/12* (2013.01); *H01L 29/404* (2013.01); *H01L 29/66136* (2013.01); *H01L 29/66348* (2013.01); *H01L 29/739* (2013.01); *H01L 29/7395* (2013.01); *H01L 29/7397* (2013.01); *H01L 29/8613* (2013.01); *H01L 29/407* (2013.01)

(58) Field of Classification Search
CPC ............. H01L 29/0834; H01L 29/1095; H01L 29/0696; H01L 29/0634; H01L 29/8613; H01L 21/324; H01L 29/407
See application file for complete search history.

(56) References Cited

U.S. PATENT DOCUMENTS

| | | | |
|---|---|---|---|
| 2008/0197379 | A1 | 8/2008 | Aono |
| 2012/0025874 | A1* | 2/2012 | Saikaku ............ H01L 29/66727 327/109 |
| 2012/0267680 | A1* | 10/2012 | Oya .................... H01L 29/0619 257/139 |
| 2013/0248882 | A1 | 9/2013 | Ogura |
| 2015/0021658 | A1 | 1/2015 | Lee |
| 2015/0069460 | A1 | 3/2015 | Hara |
| 2015/0069461 | A1 | 3/2015 | Misu |
| 2016/0359029 | A1* | 12/2016 | Zeng ................... H01L 29/7397 |
| 2017/0025410 | A1 | 1/2017 | Cheng |

FOREIGN PATENT DOCUMENTS

| | | |
|---|---|---|
| JP | 2007311627 A | 11/2007 |
| JP | 2008078397 A | 4/2008 |
| JP | 2008205015 A | 9/2008 |
| JP | 2008205500 A | 9/2008 |
| JP | 2013201360 A | 10/2013 |
| JP | 2014007254 A | 1/2014 |
| JP | 2015053400 A | 3/2015 |
| JP | 2015056482 A | 3/2015 |
| JP | 2015135954 A | 7/2015 |

* cited by examiner

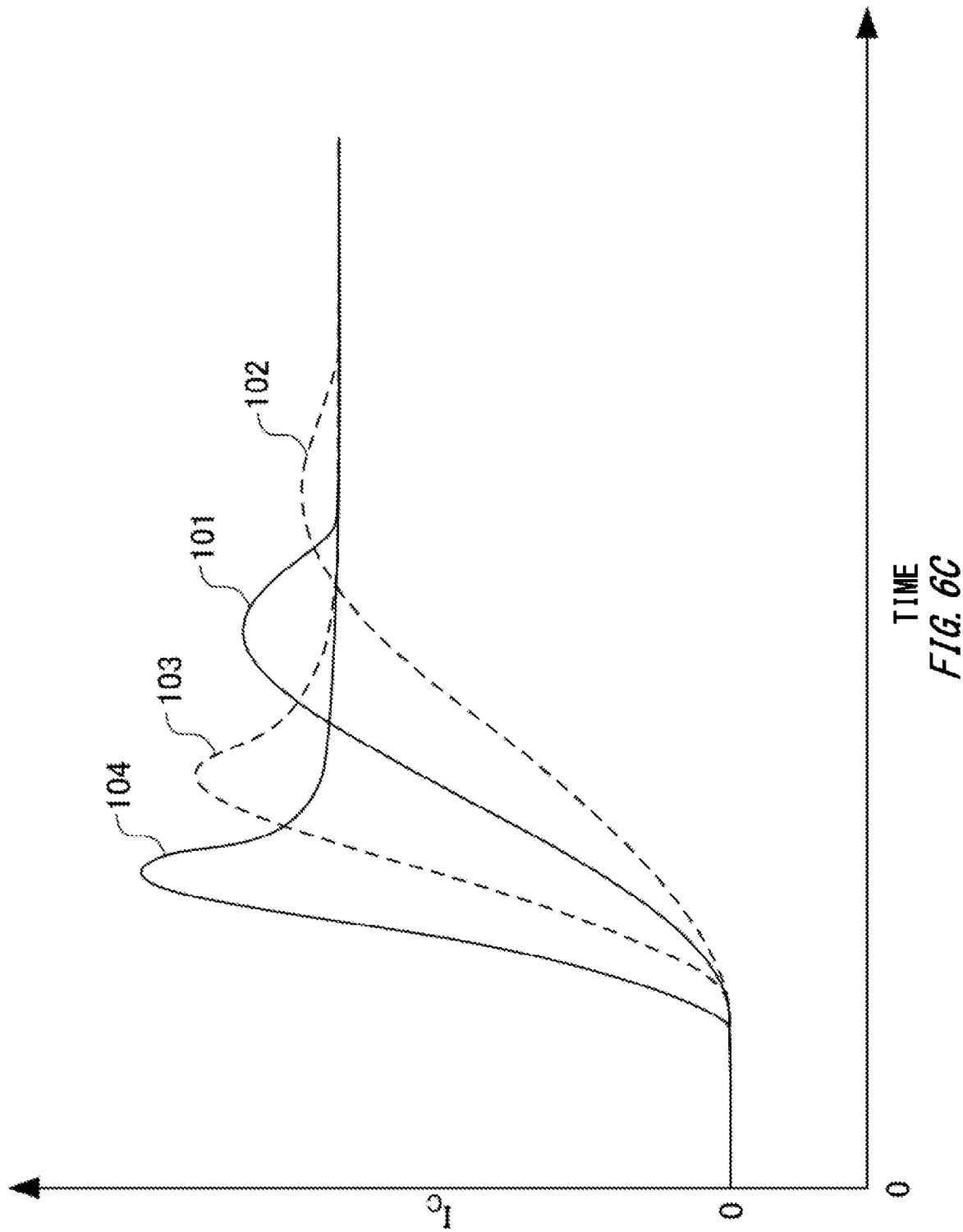

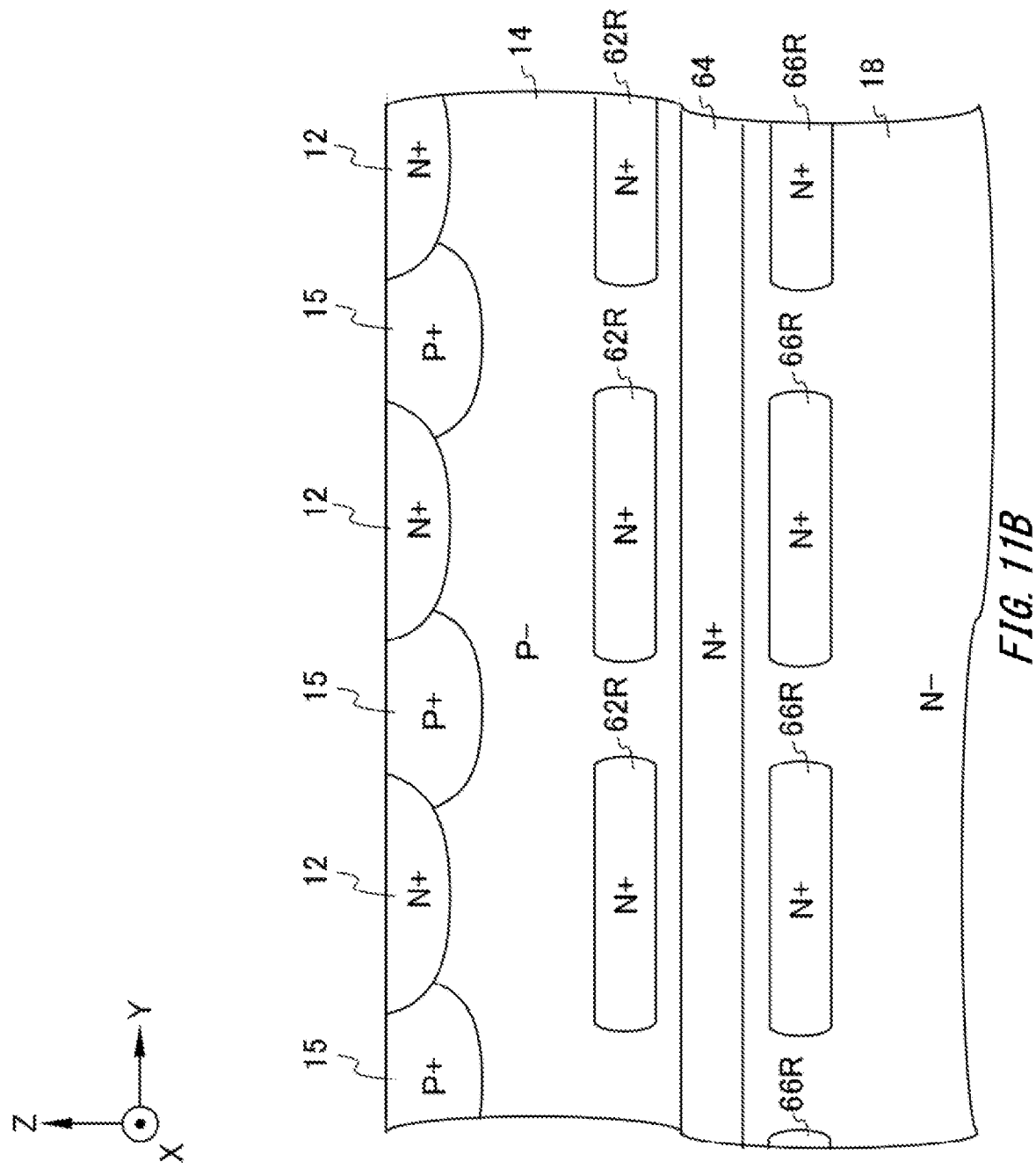

SEMICONDUCTOR DEVICE

The contents of the following Japanese patent application(s) are incorporated herein by reference:
NO. 2016-238469 filed in JP on Dec. 8, 2016,
NO. 2017-111107 filed in JP on Jun. 5, 2017, and
PCT/JP2017/044252 filed on Dec. 8, 2017.

BACKGROUND

1. Technical Field

The present invention relates to a semiconductor device.

2. Related Art

Conventionally, an insulated gate type bipolar transistor (IGBT) having a carrier accumulation layer is known (see Patent document 1, for example).

Prior Art Document

Patent Document

Patent Document 1: Japanese Patent Application Publication No. 2007-311627

SUMMARY

The carrier accumulation layer is also called an accumulation layer. The accumulation layer has a function of reducing an ON voltage (Von), which is a voltage between the collector and the emitter when turning on the IGBT, by accumulating carriers (for example, holes). However, when turning off the IGBT, the carrier contributes to a turn-off loss (Eoff).

A first aspect of the present invention provides a semiconductor device. The semiconductor device may have a semiconductor substrate. The semiconductor substrate may include two trench portions, a mesa portion, and a drift layer. The two trench portions may extend in a predetermined direction. The mesa portion may be provided between the two trench portions. The drift layer may be provided below the mesa portion. The drift layer may be of the first conductivity-type. The mesa portion may have an emitter region, a contact region, and a plurality of accumulation layers. The emitter region may have a higher doping concentration than the drift layer. Also, the emitter region may be at least partially positioned on an upper surface of the semiconductor substrate. Furthermore, the emitter region may be of the first conductivity-type. The contact region may be at least partially positioned on the upper surface of the semiconductor substrate. Also, the contact region may be of the second conductivity-type. A plurality of accumulation layers may be provided being arranged side by side in a depth direction of the semiconductor substrate below the emitter region and the contact region. The depth direction may be a direction from the upper surface to a lower surface of the semiconductor substrate. The plurality of accumulation layers may have a higher first conductivity-type doping concentration than a first conductivity-type doping concentration of the drift layer. At least one accumulation layer that is among a plurality of accumulation layers is provided below at least a part of the emitter region, but may not be provided below a partial region of the contact region.

The emitter region and the contact region may be provided alternately in a predetermined direction.

The at least one accumulation layer may not be provided below respective partial regions in the plurality of contact regions.

The at least one accumulation layer may be an island-like accumulation layer. The island-like accumulation layer may include a plurality of accumulation regions. The plurality of accumulation regions may have a higher first conductivity-type doping concentration than the first conductivity-type doping concentration of the drift layer. The plurality of accumulation regions may be each provided in a discrete manner in a plane orthogonal to the depth direction. Each of the plurality of accumulation regions is provided below at least a part of the emitter region, but may not be provided below a partial region of the contact region and may be spaced apart. All the accumulation layers other than the accumulation layer closest to the upper surface in the depth direction may be the island-like accumulation layers.

The mesa portion may further have a base region. The base region may have a lower second conductivity-type doping concentration than that of the contact region. The emitter region may have a bottom region. The bottom region, inside the semiconductor substrate, may not be in direct contact with the contact region, and may be in direct contact with the base region. A length of each of the plurality of accumulation regions in the predetermined direction may be longer than a length of the bottom region in the predetermined direction. Instead, the length of each of the plurality of accumulation regions in the predetermined direction may also be shorter than the length of the bottom region in the predetermined direction.

When the length of each of the plurality of accumulation regions in the predetermined direction is $L_{CHS}$, and the length of the bottom region in the predetermined direction of the emitter region is $L_0$, the $L_{CHS}$ and the $L_0$ may satisfy $0.5 \leq L_{CHS}/L_0 \leq 2$.

A second aspect of the present invention provides a semiconductor device. The semiconductor device may have a semiconductor substrate. The semiconductor substrate may include a transistor region. The semiconductor substrate may include a plurality of trench portions, a mesa portion, and a drift layer in the transistor region. The plurality of trench portions may extend in a predetermined direction. The mesa portion may be respectively provided between two adjacent trench portions in the plurality of trench portions. The drift layer may be provided below the mesa portion. The drift layer may be of the first conductivity-type. The plurality of trench portions may include gate trench portions and dummy trench portions. The gate trench portion may have a gate conductive portion. A gate potential may be supplied to the gate conductive portion. The dummy trench portion may have a dummy trench conductive portion. An emitter potential may be supplied to the dummy trench conductive portion. The mesa portion may have an emitter region, a contact region, and an accumulation layer. The emitter region may have a higher doping concentration than that of the drift layer. The emitter region may be at least partially positioned on the upper surface of the semiconductor substrate. The emitter region may be of the first conductivity-type. The contact region may be at least partially positioned on the upper surface of the semiconductor substrate. The contact region may be of the second conductivity-type. The accumulation layer may be provided below the emitter region and the contact region. The accumulation layer may have a higher first conductivity-type doping concentration than the first conductivity-type doping concentration of the drift layer. The number of accumulation layers provided in a depth direction in the mesa portion adjacent to the gate trench portion may be larger than the number of accumulation layers provided in the depth direction in the mesa portion between the two dummy trench portions. The depth direction may be a direction from the upper surface to the lower surface of the semiconductor substrate.

An accumulation layer may not be provided in the mesa portion between the two dummy trench portions. Instead, one accumulation layer may be provided in the mesa portion between the two dummy trench portions.

In the transistor region, a first distance between the two dummy trench portions in a direction orthogonal to the predetermined direction may be larger than a second distance between the dummy trench portion and the gate trench portion in a direction orthogonal to the predetermined direction.

The summary clause does not necessarily describe all necessary features of the embodiments of the present invention. The present invention may also be a sub-combination of the features described above.

BRIEF DESCRIPTION OF THE DRAWINGS

FIG. 6C is a diagram showing waveform examples of a collector current Ic when turning on.

(B) is a simulation result showing dV/dt with respect to $L_{CHS}/L_0$.

(C) is a simulation result showing Eoff with respect to $L_{CHS}/L_0$.

Figure 9:
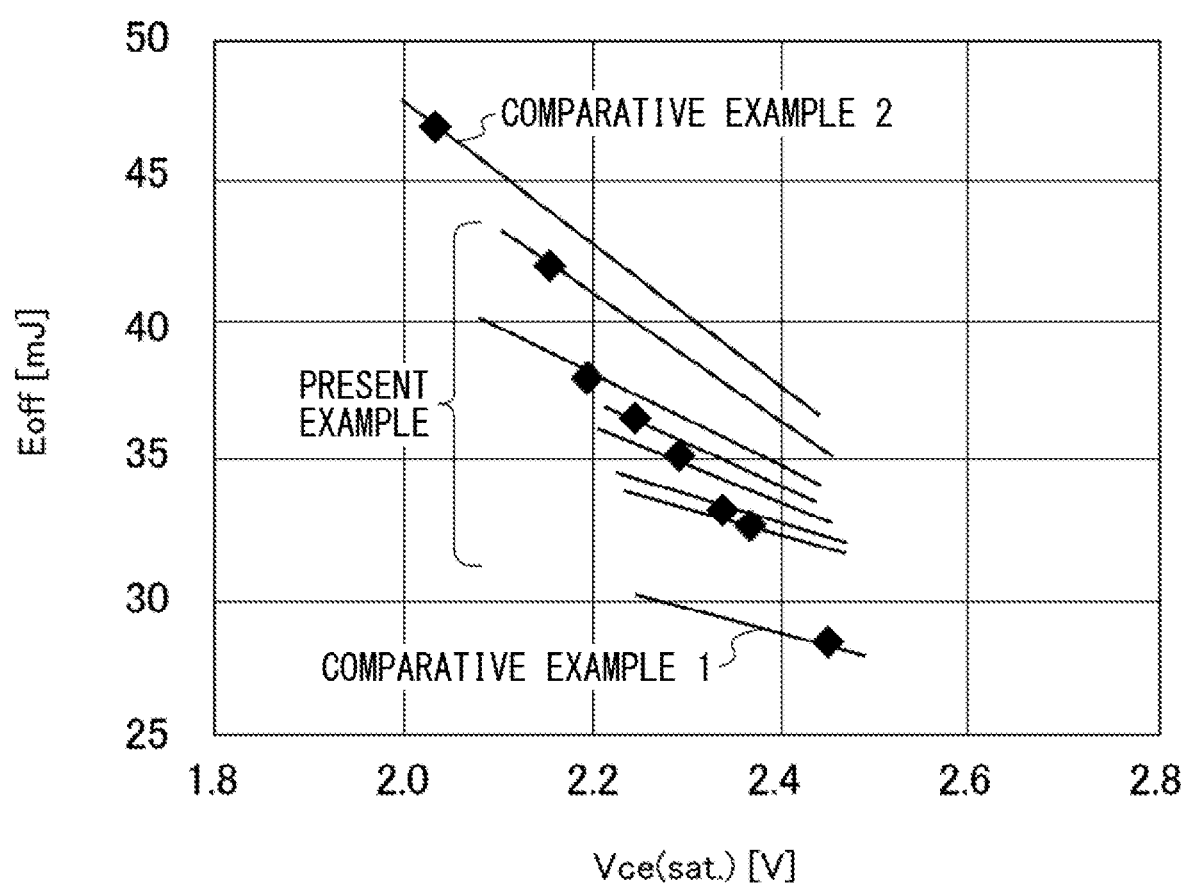

FIG. 9 is a simulation result showing Eoff with respect to Vce.

Figure 10:
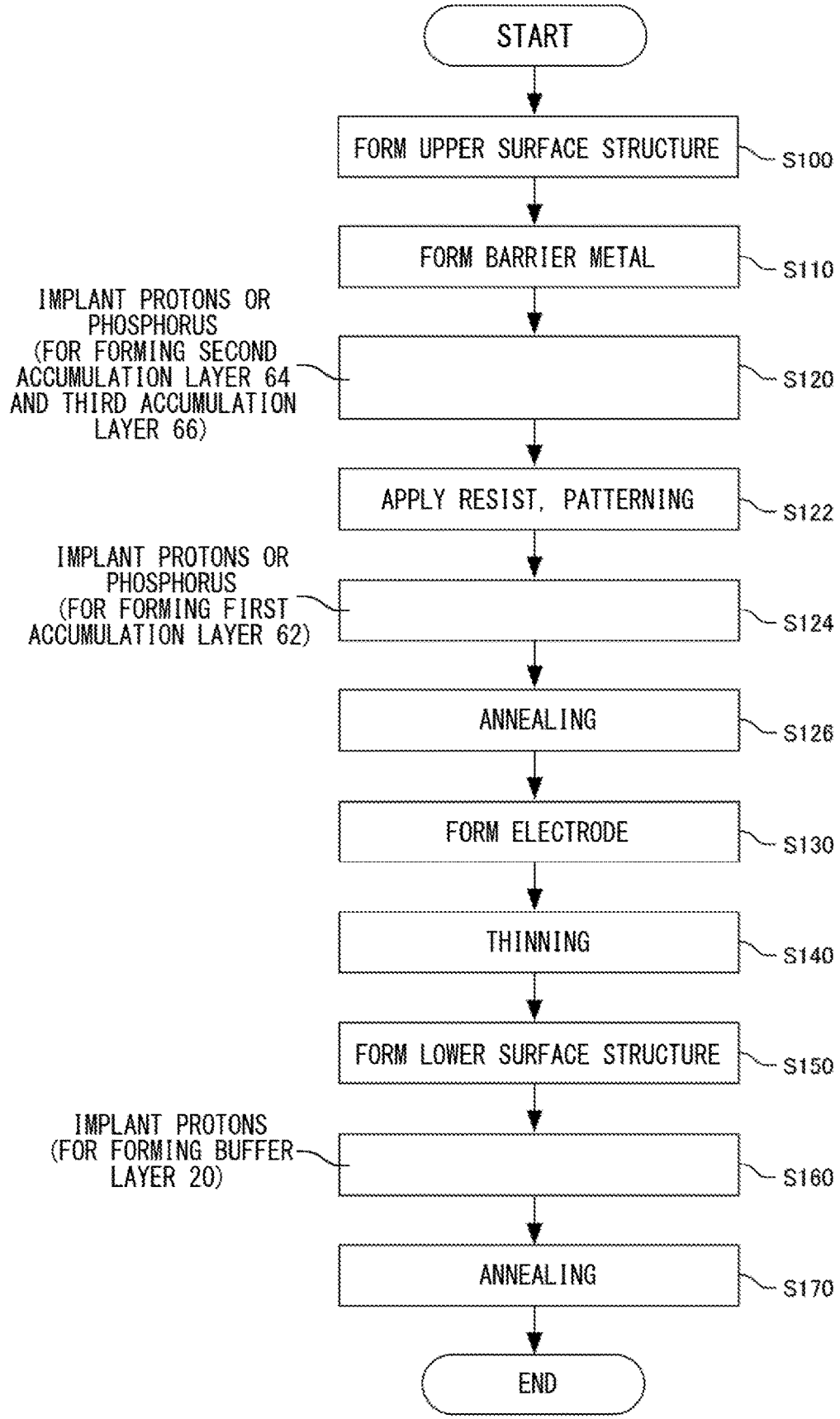

FIG. 10 is a flowchart showing one example of a manufacturing method of the semiconductor device 100.

Figure 2:
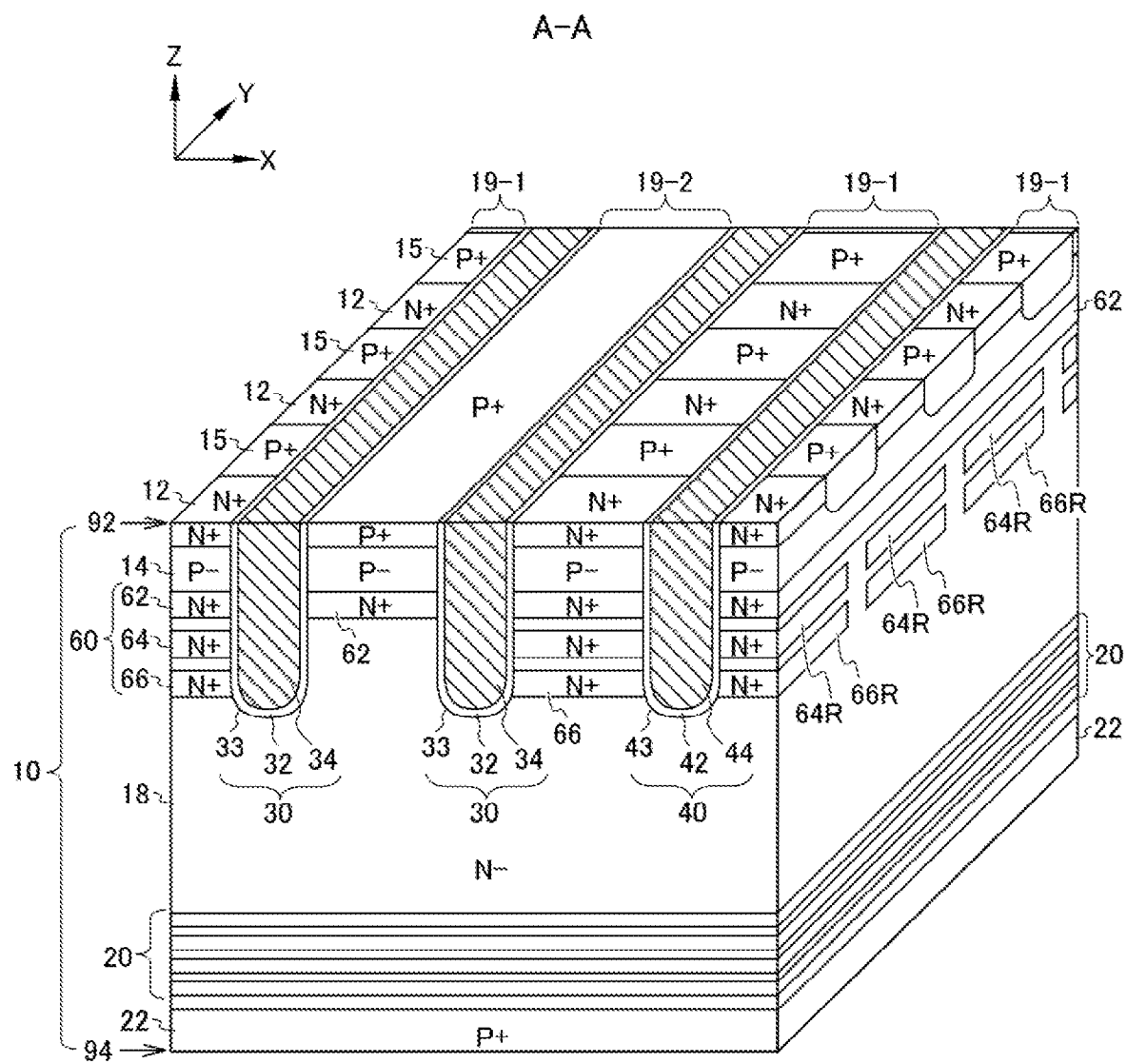
FIG. 2 is a perspective view showing one example according to the A-A cross section in FIG. 1.
Figure 11A:
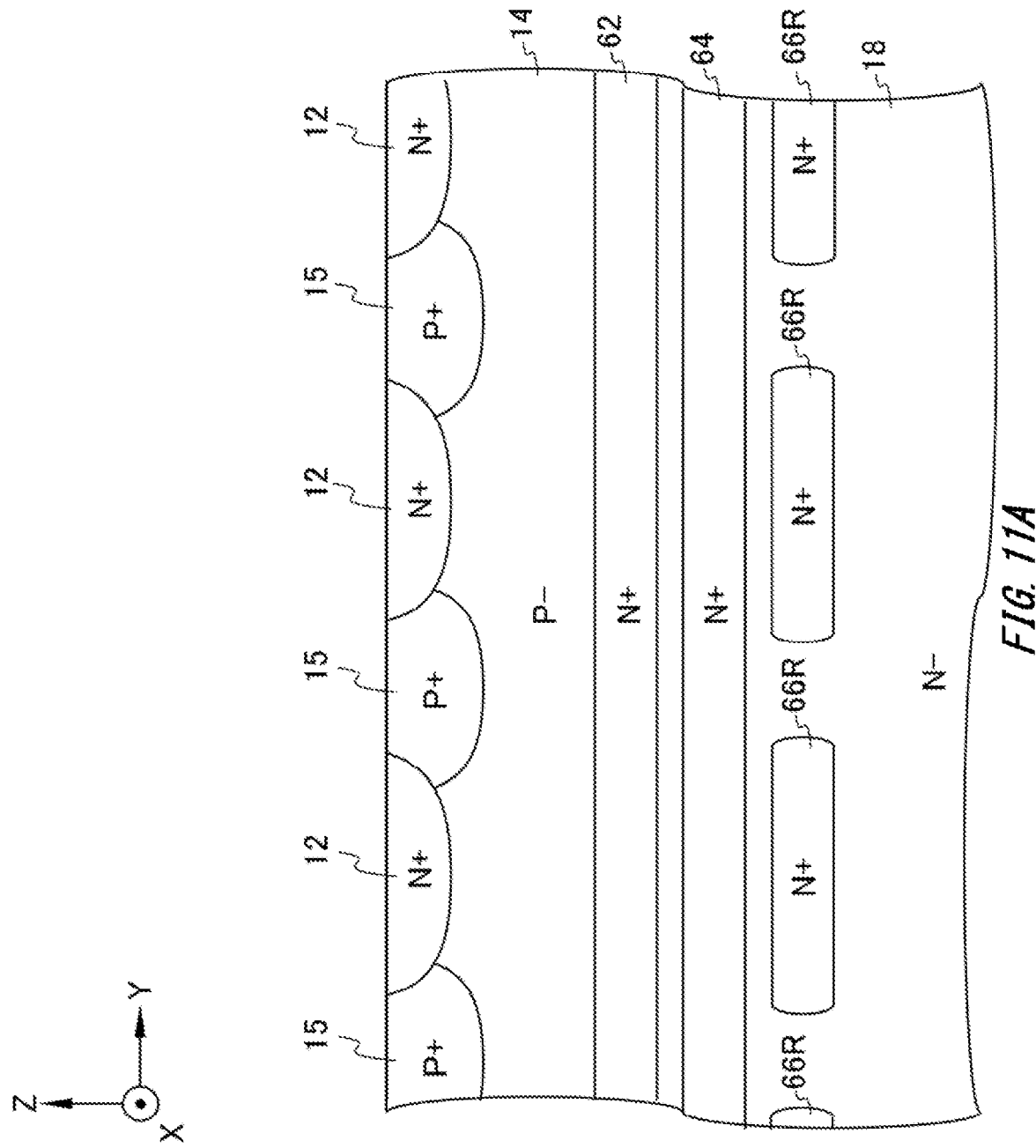

FIG. 11A is a diagram showing the Y-Z plane in FIG. 2 according to a first modification example.

FIG. 11B is a diagram showing the Y-Z plane in FIG. 2 according to a second modification example.

Figure 11C:
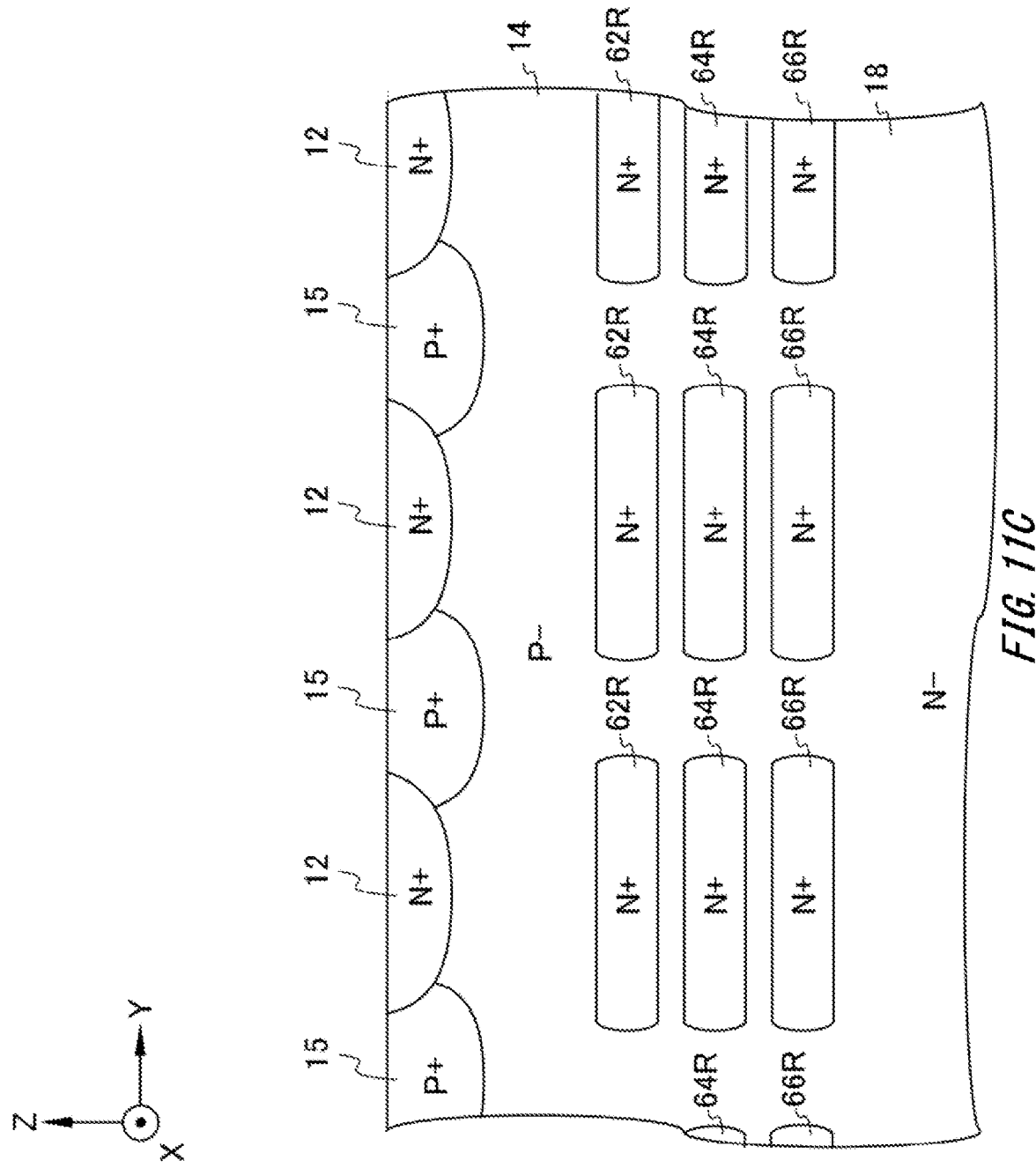

FIG. 11C is a diagram showing the Y-Z plane in FIG. 2 according to a third modification example.

Figure 1:
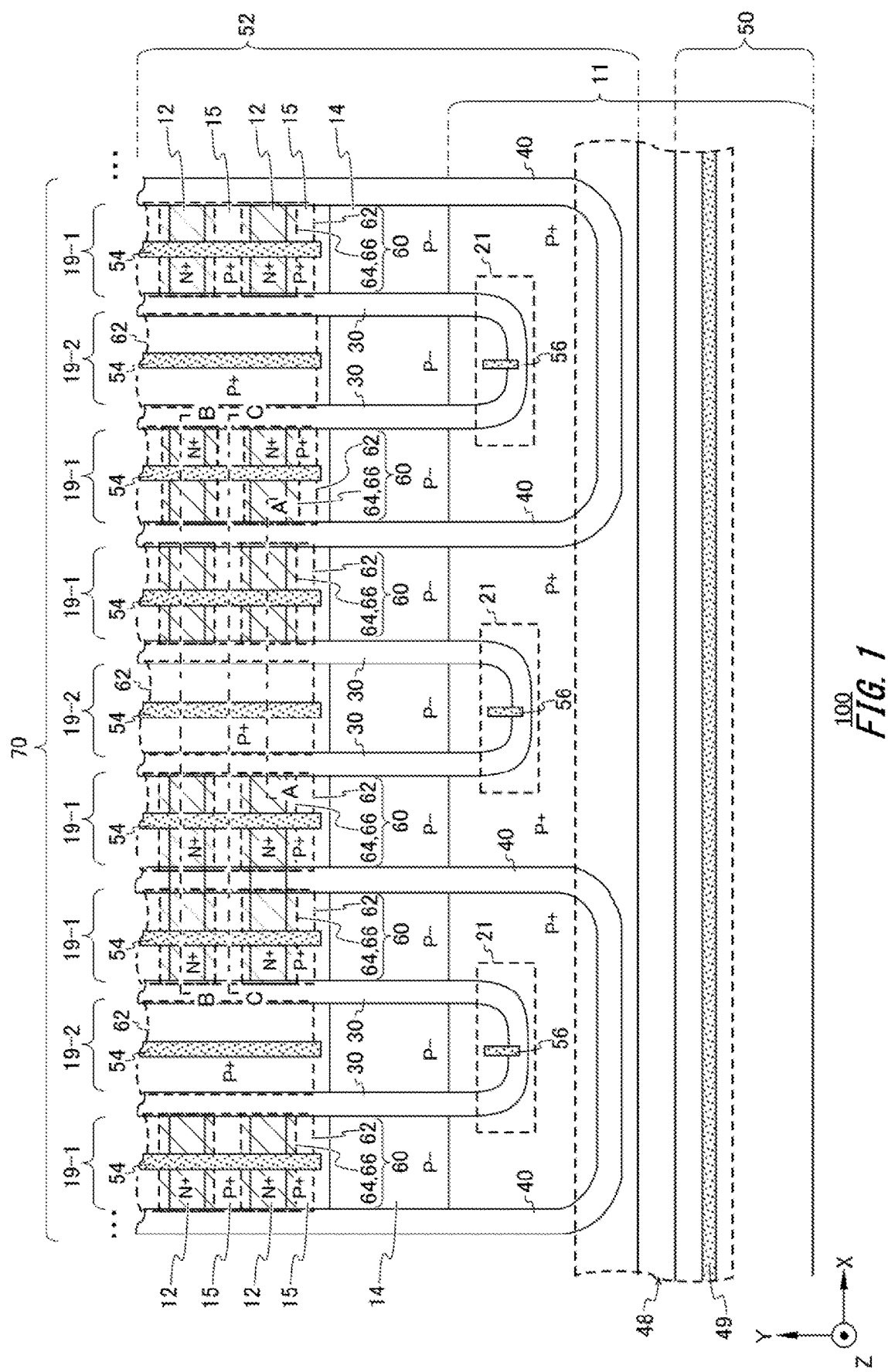
FIG. 1 is a diagram partially showing a part of the upper surface of a semiconductor device 100 according to a first embodiment.
Figure 12:
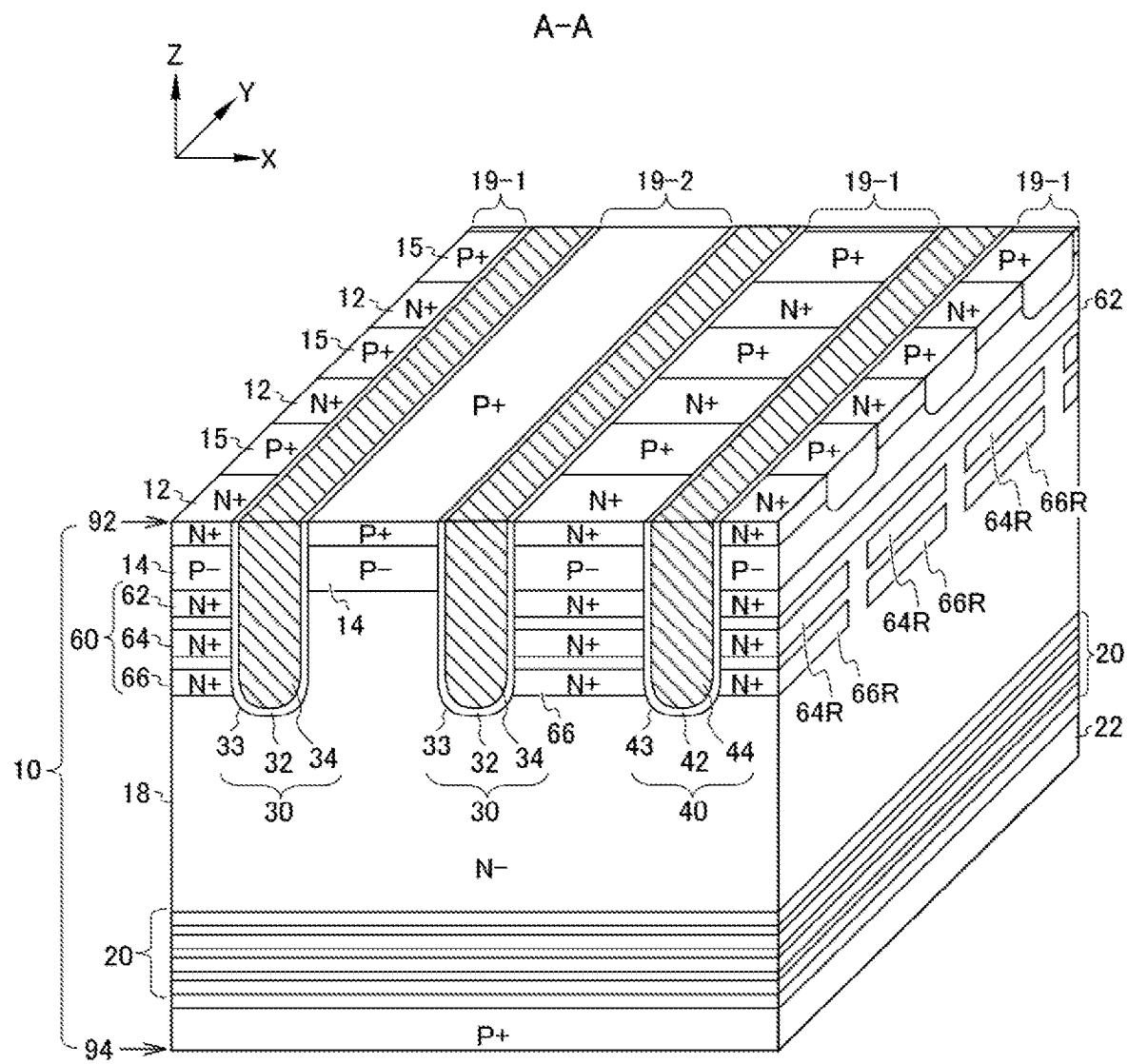

FIG. 12 is a perspective view corresponding to the A-A cross section in FIG. 1 according to a second embodiment.

Figure 13:
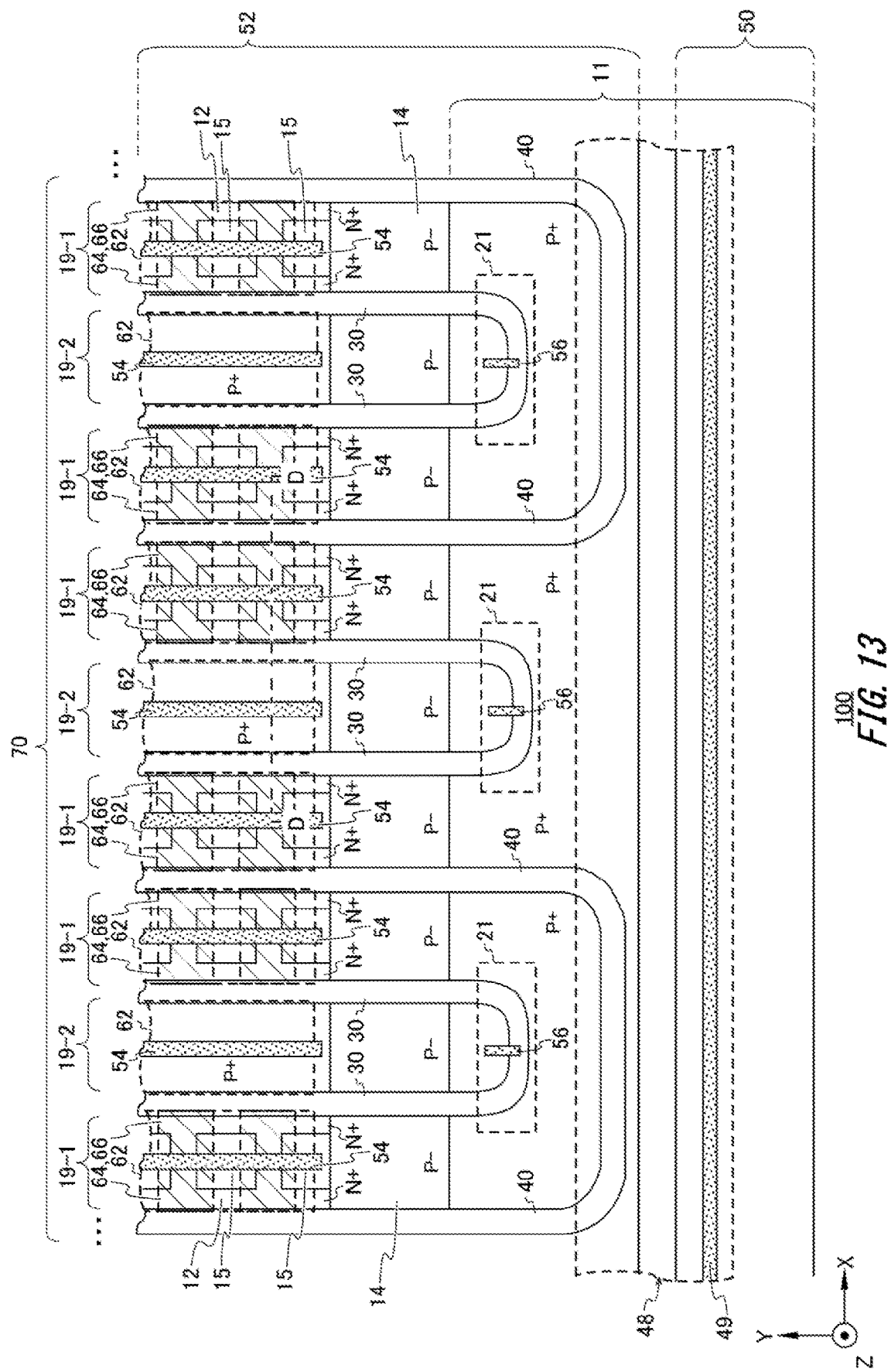

FIG. 13 is a diagram partially showing an upper surface of a semiconductor device 100 according to a third embodiment.

Figure 14:
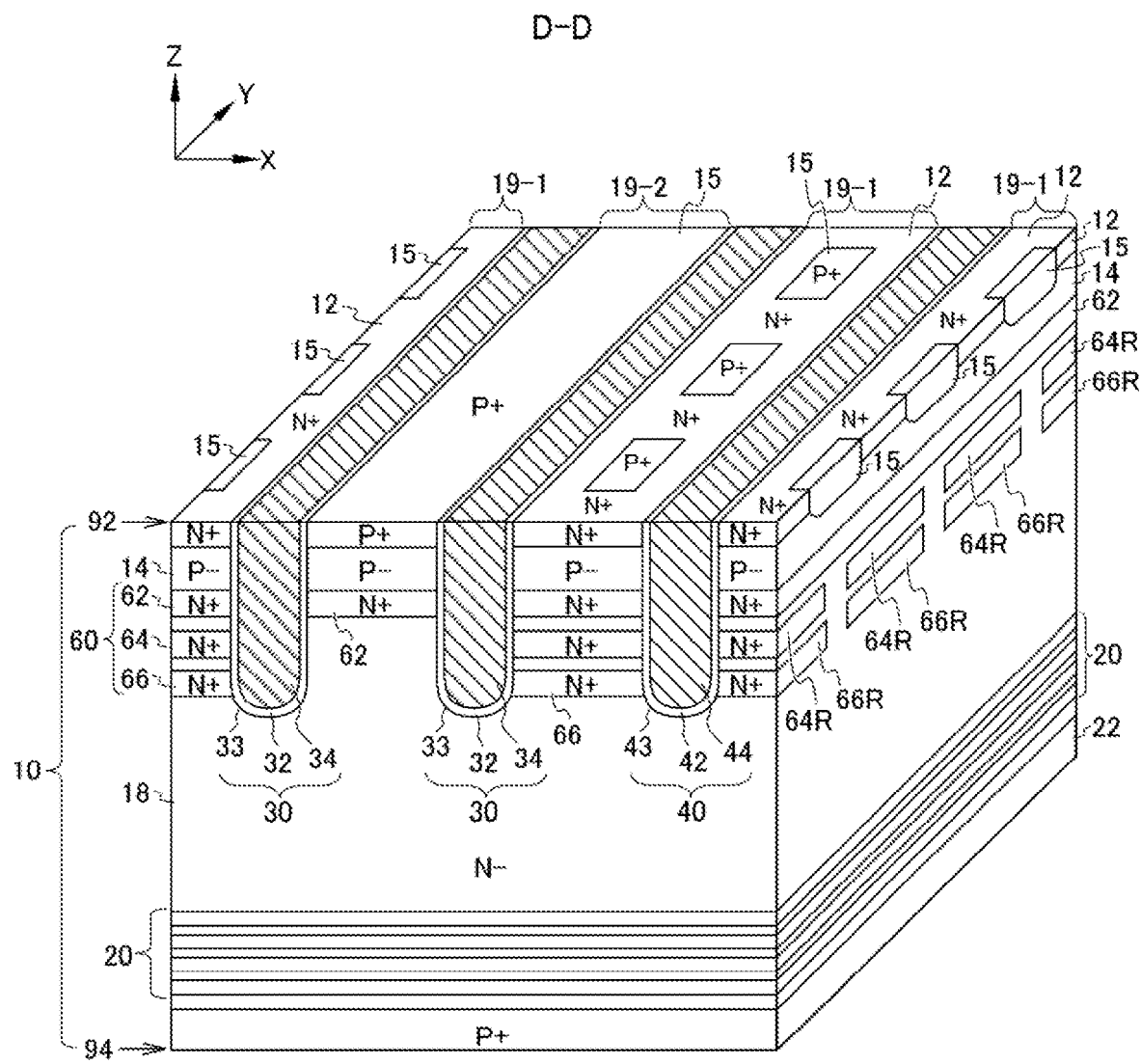

FIG. 14 is a perspective view showing one example according to the D-D cross section in the third embodiment.

Figure 15A:
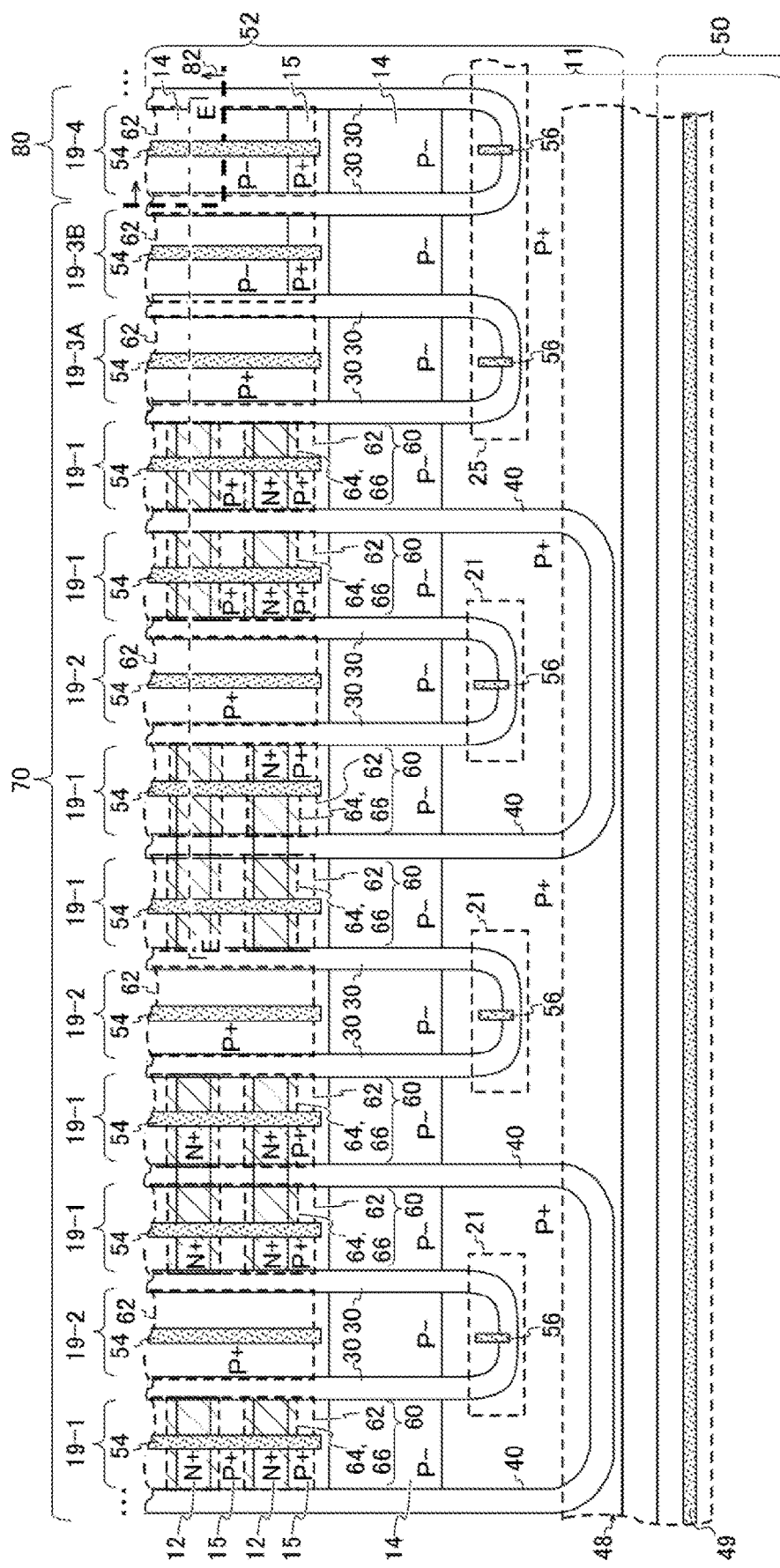

FIG. 15A is a diagram partially showing an upper surface of a semiconductor device 100 according to a fourth embodiment.

Figure 15B:
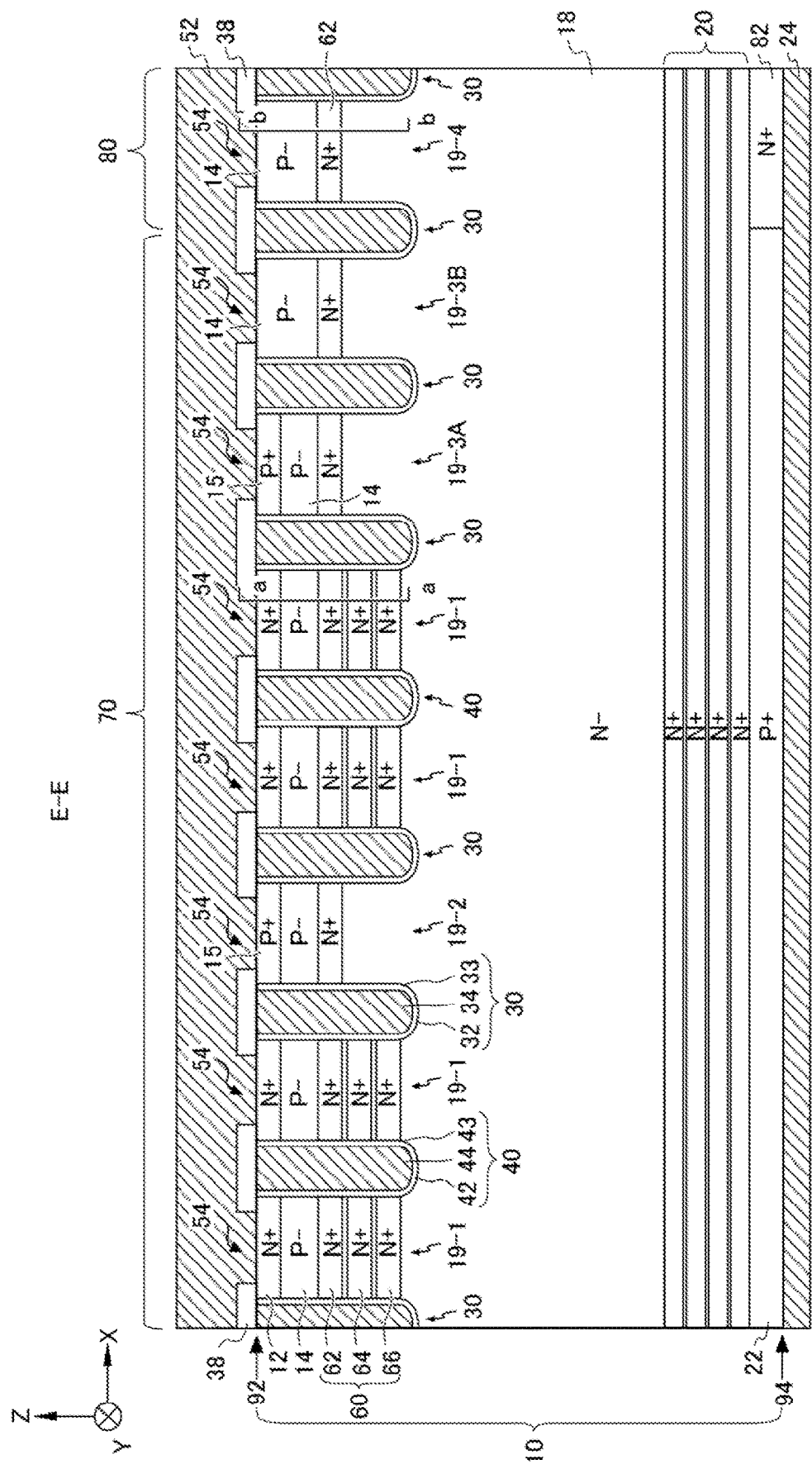

FIG. 15B is a cross-sectional view showing one example according to the E-E cross section in FIG. 15A.

Figure 16:
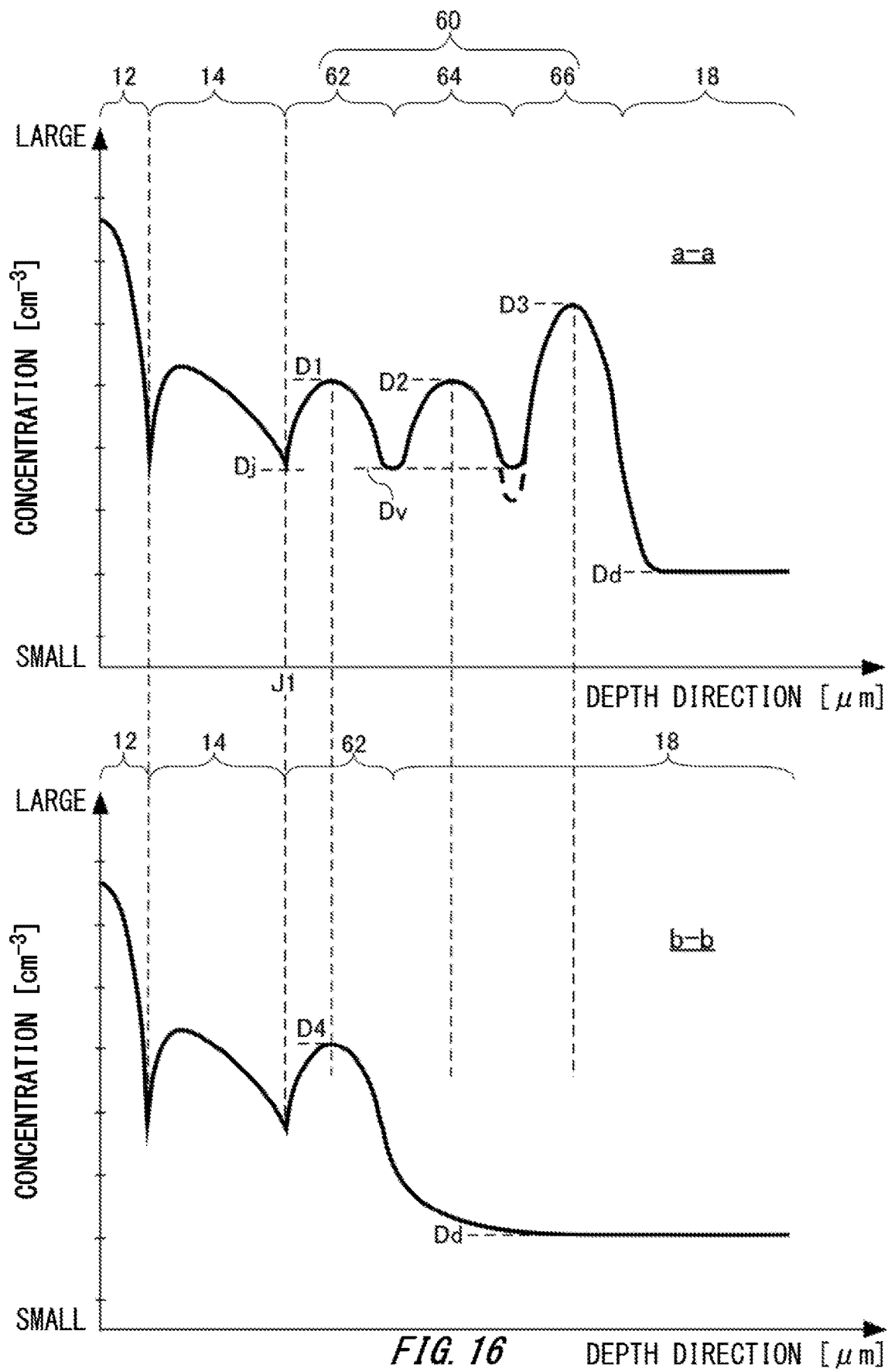

FIG. 16 is a diagram showing one example of a doping concentration distribution according to the a-a cross section and the b-b cross section in FIG. 15B.

Figure 17:
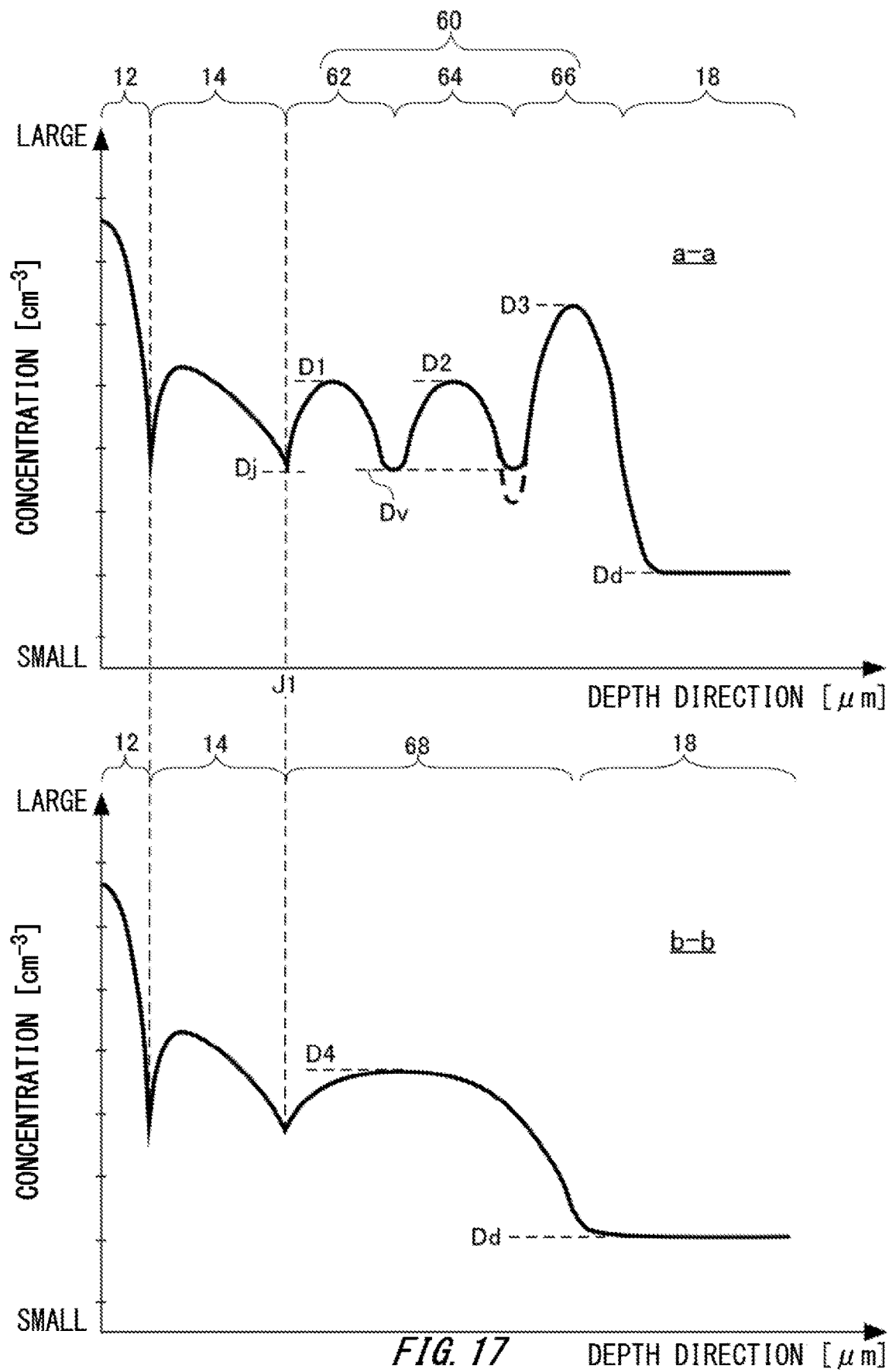

FIG. 17 is a diagram showing another example of a doping concentration distribution according to the a-a cross section and the b-b cross section in FIG. 15B.

Figure 18:
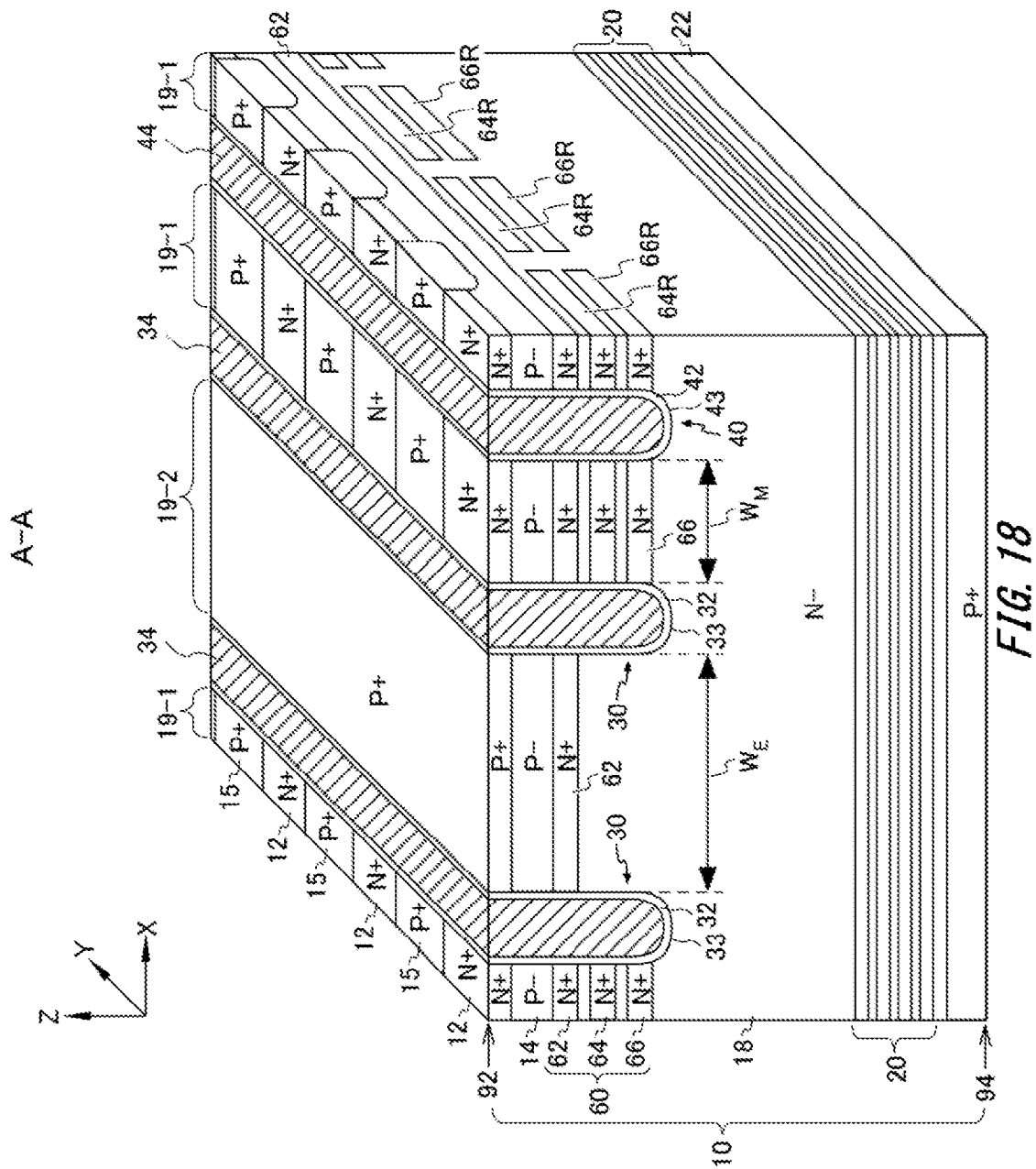

FIG. 18 is a perspective view of the A-A cross section according to a fifth embodiment.

DESCRIPTION OF EXEMPLARY EMBODIMENTS

Hereinafter, (some) embodiments) of the present invention will be described. The embodiment(s) do(es) not limit the invention according to the claims, and all the combinations of the features described in the embodiment(s) are not necessarily essential to means provided by aspects of the invention.

FIG. 1 is a diagram partially showing a part of the upper surface of the semiconductor device 100 according to a first embodiment. The semiconductor device 100 may be a reverse conducting IGBT (Reverse Conducting IGBT). The semiconductor device 100 of the present example has a semiconductor substrate including: a transistor section 70 including a transistor such as an IGBT; and a diode section, through which a current flows in a direction opposite to that of the transistor section 70, the diode section including a diode such as an FWD (Free Wheeling Diode). Note that, FIG. 1 shows a part of the upper surface around an end portion of the semiconductor substrate, and other regions are omitted. Also, FIG. 1 shows only a part of an active region including the transistor section 70. Also, the semiconductor device 100 may be a transistor such as an IGBT not including a Reverse Conducting diode.

FIG. 1 shows an active region, but the semiconductor device 100 may have an edge termination region surrounding the active region. In the present example, the active region refers to a region having the transistor section 70 and the diode section. The edge termination region has a function that relieves electric field concentration near the upper surface of the semiconductor substrate. The edge termination region has, for example, one or more of a guard ring, a field plate, a RESURF, and a combination structure thereof.

The semiconductor substrate of the the present example includes a plurality of trench portions and mesa portions 19 in the transistor section 70. The transistor section 70 is a virtual region where the collector layer is projected perpendicularly to the upper surface of the semiconductor substrate in the active region, and may be a region in which predetermined unit structures including an emitter region 12 and an contact region 15 are arranged in a regular manner. The mesa portions 19 are partial regions of the semiconductor substrate provided between the two adjacent trench portions. The mesa portions 19 are parts of the semiconductor substrate positioned in regions closer to the upper surface than the bottom portions of the trench portions. Note that, as used herein, the mesa portion 19 adjacent to the gate trench portion 40 is the mesa portion 19-1, and the mesa portion 19 between the two dummy trench portions 30 is the mesa portion 19-2. In the present example, the length in the X-axis direction of the mesa portion 19-1 and the length in the X-axis direction of the mesa portion 19-2 are the same.

Note that, as used herein, the dummy trench portion 30 and the gate trench portion 40 may be collectively referred to as a trench portion. The trench portion may extend in a predetermined direction. In the present example, the predetermined direction in which the trench portion extends is a direction parallel to the Y-axis. Such a direction may be referred to as an extending direction of the trench portion for convenience.

Also, the trench portion may be arrayed at a predetermined interval in a direction orthogonal to the extending direction. In the present example, the direction in which the trench portion is arrayed is a direction parallel to the X-axis. As used herein, such a direction may be referred to as an array direction of the trench portion.

In the present example, the X-axis and the Y-axis are axes which are orthogonal to each other in a plane parallel to the upper surface of the semiconductor substrate. Also, the axis orthogonal to the X-axis and the Y-axis is referred to as the Z-axis. Note that, as used herein, the direction directed from the upper surface to the lower surface of the semiconductor substrate is referred to as a depth direction in some cases. The depth direction is a direction parallel to the Z-axis.

Note that, as used herein, directions indicated by the terms "upper", "lower", "above" and "below" are not limited to upper and lower directions in the gravitational direction. These terms merely refer to relative directions with respect to a predetermined axis.

In the present example, the gate trench portions 40 and the dummy trench portions 30 are provided alternately along the array direction. The gate trench portions 40 and the dummy trench portions 30 have longitudinal portions respectively extending along an extending direction. The gate trench portions 40 of the present example have two longitudinal portions and a lateral portion connecting these two longitudinal portions. At least a part of the lateral portion is preferably provided in a curved shape. By connecting the end portions of the two longitudinal portions of the gate trench portions 40, it is possible to relieve electric field concentration on the end portions of the longitudinal portions. A gate runner 48 may be connected to a gate conductive portion at the lateral portion of the gate trench portion 40.

In the transistor section 70, the dummy trench portions 30 may be provided between the longitudinal portions of the gate trench portions 40. In the present example, one dummy trench portion 30 is provided between the two longitudinal portions of the gate trench portion 40 provided in a continuous manner by longitudinal portions and a lateral portion in the plane parallel to the upper surface of the semiconductor substrate.

The mesa portions 19 of the semiconductor substrate may have emitter regions 12 respectively provided at the predetermined depth from the upper surface, base regions 14, contact regions 15, a plurality of accumulation layers 60, and a well region 11. The plurality of accumulation layers 60 may have one or more accumulation layers. Two or more accumulation layers may be provided being arranged side by side in the depth direction. In the present example, the plurality of accumulation layers 60 have first accumulation layers 62, second accumulation layers 64, and third accumulation layers 66. The plurality of accumulation layers 60 may be provided below the emitter regions 12 and the contact regions 15. Therefore, in FIG. 1, the first accumulation layer 62 is indicated by the dashed lines, and the second accumulation layer 64 and the third accumulation layer 66 are indicated by the dashed lines filled with hatched lines.

In the present example, the plurality of accumulation layers 60 are provided in the mesa portion 19-1 positioned between the longitudinal portion of the gate trench portion 40 and the longitudinal portion of the dummy trench portion 30. Note that, in the mesa portion 19-2, only the first accumulation layer 62 is provided. Some of the plurality of accumulation layers 60 may be provided continuously in the extending direction of the trench portion. In the present example, the first accumulation layer 62 is provided continuously in the extending direction of the trench portion from the contact region 15 closest to the well region 11.

In contrast, at least one accumulation layer that is among the plurality of accumulation layers 60 is provided below at least a part of the emitter region 12, but may not be provided below a partial region of the contact region 15. The at least one accumulation layer may not be provided below a partial region of each contact region 15 provided in the extending direction of the trench portion. In the present example, the second accumulation layer 64 and the third accumulation layer 66 are intermittently provided so as to be interrupted directly below the contact region 15 in the extending direction of the trench portion. Note that, the second accumulation layer 64 and the third accumulation layer 66 of the present example are provided in the same range in the X-Y plane parallel to the upper surface of the semiconductor substrate.

In the present example, among the plurality of accumulation layers 60, the first accumulation layer 62 is provided at a position closest to the upper surface of the semiconductor substrate in the depth direction. That is, the first accumulation layer 62 is provided at a position shallowest in the depth direction. In contrast, the third accumulation layer 66 is provided at a position deepest in the depth direction. The second accumulation layer 64 is provided between the first accumulation layer 62 and the third accumulation layer 66 in the depth direction.

In this manner, in the present example, the first accumulation layer 62 is provided in a wider range than the second accumulation layer 64 and the third accumulation layer 66. That is, in the present example, when the semiconductor substrate is viewed from the upper surface, the first accumulation layer 62 of the present example covers the second accumulation layer 64 and the third accumulation layer 66.

The semiconductor device 100 of the present example further comprises a gate metal layer 50 and an emitter electrode 52 provided above the upper surface of the semiconductor substrate. The gate metal layer 50 and the emitter electrode 52 are provided being separated from each other. Although an interlayer insulating film is provided between each of the emitter electrode 52 and the gate metal layer 50 and the upper surface of the semiconductor substrate, it is omitted in FIG. 1. The interlayer insulating film of the present example has contact holes 49, 54 and 56. The contact holes 49, 54 and 56 of the present example are provided penetrating the interlayer insulating film. In FIG. 1, the contact holes 49, 54 and 56 are indicated with dots.

The emitter electrode 52 may contact the emitter regions 12 and the contact regions 15 in the upper surface of the semiconductor substrate through the contact holes 54. The emitter electrode 52 may also be electrically connected to the base region 14 through the contact region 15. The emitter electrode 52 may also be connected to dummy trench conductive portions in the dummy trench portions 30 through the contact holes 56. Connecting portions 21 formed of conductive materials such as polysilicon doped with impurities or the like may be provided between the emitter electrode 52 and the dummy trench conductive portions. The connecting portions 21 may be respectively provided on the upper surface of the semiconductor substrate through the insulating film.

The gate metal layer 50 may contact a gate runner 48 through the contact holes 49. The gate runner 48 may be formed of polysilicon doped with impurities or the like. The gate runner 48 may be connected to gate conductive portions within the gate trench portions 40 in the upper surface of the semiconductor substrate. The gate runner 48 of the present example is not connected to the dummy trench conductive portions of the dummy trench portions 30. The gate runner 48 of the present example is provided from below the contact holes 49 to the lateral portion of the gate trench portion 40. In the lateral portion of the gate trench portion 40, the gate conductive portion of the present example is exposed on the upper surface of the semiconductor substrate and contacts the gate runner 48.

The emitter electrode 52 and the gate metal layer 50 are formed of a metal-containing material. For example, at least a partial region of each electrode is formed of aluminum, an aluminum-silicon alloy, or the like. Each electrode may have a barrier metal formed of titanium, a titanium compound or the like as an underlying layer of a region formed of aluminum or the like. By providing the barrier metal, diffusion of aluminum atoms into the semiconductor substrate can be reduced.

Also, a plug may be provided in the contact holes 49, 54 and 56 between each electrode and the semiconductor substrate. The plug may have a barrier metal which is in contact with the semiconductor substrate, and tungsten which are formed being embedded so as to be in contact with the barrier metal. In the plug, the tungsten and the barrier metal may be in contact with each other.

The emitter electrode 52 may be provided above the well region 11, the emitter regions 12, the base regions 14, the contact regions 15 and the trench portions. The well region 11 of the present example is provided in a predetermined range from near the lateral portion of the trench portion to the outside end portion of the gate metal layer 50 positioned outside the gate runner 48. The depth at which the well region 11 is provided in the semiconductor substrate may be greater than the depth of the trench portion. A partial region which is a partial region of the trench portion and is close to the gate metal layer 50 may be provided in the well region 11. The bottoms of the end portions in the extending direction of the dummy trench portion 30 and the gate trench portion 40 may be covered by the well region 11.

The mesa portion 19 of the present example has a base region 14. The base region 14 may have a lower second conductivity-type doping concentration than that of the contact region 15. The base region 14 of the present example is of P--type. Note that, in the present example, the first conductivity-type is of N-type and the second conductivity-type is of P-type. However, in another example, the first conductivity-type may be of P-type, and the second conductivity-type may be of N-type.

The mesa portion 19 has a second conductivity-type contact region 15 having a higher doping concentration than that of the base region 14 on the upper surface of the base region 14. The contact region 15 is selectively provided in the semiconductor substrate so that it is at least partially positioned on the upper surface of the semiconductor substrate. The contact region 15 of the present example is of P+-type. Note that, in FIG. 1, the base region 14 positioned below the contact region 15 is not shown.

The mesa portion 19 also has a first conductivity-type emitter region 12 provided adjacent to the contact region 15 in the upper surface of the base region 14. The emitter region 12 is also selectively provided in the semiconductor substrate so that it is at least partially positioned on the upper surface of the semiconductor substrate. The emitter region 12 of the present example may have a higher first conductivity-type doping concentration than the first conductivity-type doping concentration of the drift layer of the semiconductor substrate. The emitter region 12 of the present example is of N+-type.

The plurality of accumulation layers 60 may have a higher first conductivity-type doping concentration than the first conductivity-type doping concentration of the drift layer of the semiconductor substrate. In the present example, each of the plurality of accumulation layers 60 is of N+-type. Each of the plurality of accumulation layers 60 may have a peak position of the doping concentration at a predetermined depth position, and the doping concentration may gradually decrease in the upper and lower directions around the peak position. Therefore, each of the accumulation layers can be identified as different layers in the depth direction of the mesa portion 19.

Each of the contact regions 15 and the emitter regions 12 is provided from the gate trench portion 40 to the dummy trench portion 30, which are adjacent to each other in the X-axis direction. The emitter regions 12 and the contact region 15 of the present example are provided alternately along the extending direction of the trench portion.

The contact holes 54 are provided above each region of contact regions 15 and emitter regions 12. The contact holes 54 are not provided in a region corresponding to the base regions 14 and the well region 11 shown in FIG. 1. Note that, the well region 11 is a second conductivity-type region having a higher doping concentration than that of the base regions 14. The well region 11 of the present example is of P+-type regions.

FIG. 2 is a perspective view showing one example according to the A-A cross section in FIG. 1. Note that, for the purpose of easy understanding, in FIG. 2, the configurations above the upper surface 92 and below the lower surface 94 of the semiconductor substrate 10 are omitted. In FIG. 2, a semiconductor substrate 10, a drift layer 18, a buffer layer 20, and a collector layer 22 are additionally shown.

The semiconductor substrate 10 may be a silicon substrate, may be a silicon carbide substrate, may be a gallium oxide substrate, or may be a nitride semiconductor substrate such as gallium nitride or the like. The semiconductor substrate 10 of the present example is a silicon substrate. The first conductivity-type drift layer 18 may be provided below the mesa portion 19. Note that the drift layer 18 of the present example is of N--type. The buffer layer 20 and the collector layer 22 will be described below.

The mesa portion 19-1 of the present example has, in the order from the upper surface 92 to the lower surface 94, N+-type emitter regions 12 and P+-type contact regions 15, a P--type base region 14, and a plurality of accumulation layers 60 (in the present example, a first accumulation layer 62, a second accumulation layer 64, and a third accumulation layer 66). In particular, by providing a plurality of accumulation layers 60 between the base region 14 of the mesa portion 19-1 and the drift layer 18, the carrier injection enhancement effect (Injection Enhancement effect: IE effect) can be increased, and the Von can be reduced. Note that, the mesa portion 19-2 of the present example has, in the order from the upper surface 92 to the lower surface 94, P+-type contact regions 15, a P--type base region 14, and a first accumulation layer 62.

As described above, the first accumulation layer 62 of the present example is provided between each trench portion, and is provided extending in the extending direction of the trench portion. In contrast, the second accumulation layer 64 and the third accumulation layer 66 are provided between the dummy trench portion 30 and the gate trench portion 40, and are provided in a discrete manner in the extending direction of the trench portion. The first accumulation layer 62 that is the most closest to the upper surface 92 may be in contact with the base region 14 at its top. Also, the third accumulation layer 66 formed on the most-lower surface 94 side may be closer to the upper surface 92 side than an end portion of the bottom portion of the trench portion at its lower portion. That is, a plurality of accumulation layers 60 may be provided in the mesa portion 19 more on the upper surface 92 side than the bottom portion of the trench portion.

Because a plurality of accumulation layers 60 are provided in the present example, Von can be reduced compared to the case in which only the first accumulation layer 62 is provided. Furthermore, in the present example, the second accumulation layer 64 and the third accumulation layer 66 are intermittently provided so as to be interrupted below a partial region of the contact region 15. This can discharge carriers (holes in the present example) to the contact region 15 more efficiently compared to the case in which all the layers of the plurality of accumulation layers 60 are continuous in the extending direction of the trench portion like the first accumulation layer 62 (the case in which all the layers are continuous in the extending direction). Accordingly, this can reduce Eoff, which is a loss when turning off the IGBT compared to the case in which all the layers of the plurality of accumulation layers 60 are continuous in the extending direction. In this manner, in the present example, trade-off of Von and Eoff can be improved.

At least one accumulation layer which is discontinuous directly below the contact region 15 may be an island-like accumulation layer. As used herein, the island-like accumulation layer means a layer including a plurality of accumulation regions which are respectively provided in a discrete manner in the plane orthogonal to the depth direction. Also, as used herein, the plurality of accumulation regions mean region having a higher N-type doping concentration than the N-type doping concentration of the drift layer 18. Each of the plurality of accumulation regions which are provided in an island-like manner is provided below at least a part of the emitter region 12, but is not be provided below a partial region of the contact region 15 and is spaced apart from each other.

In the present example, all the accumulation layers other than the first accumulation layer 62 are island-like accumulation layers. That is, the second accumulation layer 64 has a plurality of second accumulation regions 64R, and the third accumulation layer 66 has a plurality of third accumulation regions 66R. This can reduce Eoff compared to the case in which the second accumulation layer 64 and the third accumulation layer 66 are continuous in the extending direction.

Note that, as will be described below in another example, the second accumulation layer 64 may be continuously provided in the extending direction, and the first accumulation layer 62 and the third accumulation layer 66 may be island-like accumulation layers. Instead, the first accumulation layer 62 and the second accumulation layer 64 may be provided continuously in the extending direction, and the third accumulation layer 66 may be an island-like accumulation layer. Furthermore, instead, all of the first accumulation layer 62, the second accumulation layer 64, and the third accumulation layer 66 may be island-like accumulation layers.

The accumulation regions in the accumulation layers and the island-like accumulation layers which are continuously provided may have the N-type doping concentration ten times or more, or thirty times or more, or one hundred times or more, or three hundred times or more greater than the doping concentration of the drift layer 18. For example, the first accumulation layer 62, the second accumulation region 64R, and the third accumulation region 66R of the present example may have the N-type doping concentration one hundred times or more greater than the doping concentration of the drift layer 18.

Also, the peak value in the depth direction of the N-type doping concentration in the third accumulation region 66R may be higher than the peak values in the depth direction of the N-type doping concentration in the first accumulation layer 62 and the second accumulation region 64R. The peak values in the depth direction of the N-type doping concentration in the first accumulation layer 62 and the second accumulation region 64R may be approximately the same. The position of the peak concentration in the depth direction can be determined by the accelerating energy when ion-implanting the N-type impurities.

Note that, the doping concentration of the drift layer 18 may be the doping concentration between the lower end of the trench portion and the buffer layer 20 in the depth direction. The doping concentration of the drift layer 18 is, for example, net doping concentration at the intermediate position between the lower end of the trench portion and the buffer layer 20 in the depth direction. The doping concentration of the drift layer 18 may be an average value of doping concentrations in a predetermined depth range. In one example, the doping concentration of the drift layer 18 may be an average value of the doping concentrations from a position which is just 1 μm below the lower end of the gate trench portion 40 to a position which is just 1 μm above the boundary between the drift layer 18 and the buffer layer 20.

In one island-like accumulation layer, a region between the accumulation regions may have a lower first conductivity-type doping concentration than the first conductivity-type doping concentration in the accumulation region. For example, in the second accumulation layer, the N-type doping concentration of the region between the two accumulation regions 64R is lower than the N-type doping concentration of the second accumulation region 64R. Also, in one island-like accumulation layer, the region between the accumulation regions may have a doping concentration greater than or equal to the first conductivity-type doping concentration in the drift layer 18. For example, in the second accumulation layer, the N-type doping concentration of the region between the two second accumulation regions 64R is the same as the N-type doping concentration of the drift layer 18. Accordingly, carriers can proceed upward from below penetrating through the region between the two accumulation regions more easily, compared to the case in which carriers proceed upward from below penetrating through the accumulation region.

Also, the number of accumulation layers in the mesa portion 19-1 adjacent to the gate trench portion 40 may be larger than the number of accumulation layers in the mesa portion 19-2 between the two dummy trench portions 30. In the present example, the number of accumulation layers of the mesa portion 19-1 is three (the first accumulation layer 62, the second accumulation layer 64, and the third accumulation layer 66). In contrast, the number of accumulation layers of the mesa portion 19-2 is one (only the first accumulation layer 62).

In this manner, the carriers can be efficiently extracted from the contact region 15 between the respective dummy trench portions 30 when turning off, compared to the case where the number of the accumulation layers in the mesa portion 19-2 is larger than or equal to the number of accumulation layers in the mesa portion 19-1. This can reduce Eoff.

Note that, in another example, the mesa portion 19-2 may have no accumulation layer. In this manner, the carriers can be more efficiently extracted when turning off, compared to the case where there is one accumulation layer provided in the mesa portion 19-2.

An N+-type buffer layer 20 is provided on the lower surface of the drift layer 18. The doping concentration of the buffer layer 20 may be higher than the doping concentration of the drift layer 18. The buffer layer 20 of the present example includes an N+-type dopant implantation region having a plurality of peaks of doping concentration in the depth direction. The buffer layer 20 may function as a field stop layer that prevents the depletion layer spreading from the lower surface of the base region 14 from reaching the P+-type collector layer 22.

The dummy trench portion 30 and the gate trench portion 40 penetrate the base region 14 from the upper surface 92 of the semiconductor substrate 10 and reach the drift layer 18. In the planar view of the upper surface 92 of the semiconductor substrate 10, in the region where at least any of the emitter region 12, the contact region 15, the accumulation layer and the accumulation region is provided, the dummy trench portion 30 and the gate trench portion 40 penetrate these regions as well and reach the drift layer 18. Note that, a configuration in which a trench portion penetrates dopant implantation region is not limited to a configuration that is manufactured by performing processes of forming a dopant implantation region and then forming a trench portion in this order. A configuration that is manufactured by forming trench portions and then forming a dopant implantation region between the trench portions is also included in a configuration in which a trench portion penetrates a dopant implantation region.

The gate trench portion 40 has a gate trench 43, a gate insulating film 42, and a gate conductive portion 44 provided in the semiconductor substrate 10. The gate insulating film 42 is provided covering the inner wall of the gate trench 43. The gate insulating film 42 may be formed by oxidizing or nitricling the semiconductor of the inner wall of the gate trench 43. The gate insulating film 42 insulates the gate conductive portion 44 from the semiconductor substrate 10. The gate conductive portion 44 is inside the gate trench 43, and is provided on an inner side relative to the gate insulating film 42. The gate conductive portion 44 is formed of a conductive material such as polysilicon. A gate potential is supplied from a gate metal layer 50 to the gate conductive portion 44.

Apart of the gate conductive portion 44 faces the base region 14 in the array direction. A portion of the base region 14 facing the gate conductive portion 44 may function as a channel forming region. When a predetermined voltage is applied to the gate conductive portion 44, a channel is formed in a surface layer of an interface of the base region 14, the interface being in contact with the gate trench 43.

The dummy trench portion 30 may have a similar structure to the gate trench portion 40. The dummy trench conductive portion 34 may have the same length in the depth direction as the gate conductive portion 44. The dummy trench portion 30 has a dummy trench 33, a dummy trench insulating film 32, and a dummy trench conductive portion 34 provided in the semiconductor substrate 10. The dummy trench insulating film 32 is provided covering the inner wall of the dummy trench 33. The dummy trench insulating film 32 insulates the dummy trench conductive portion 34 from the semiconductor substrate 10. The dummy trench conductive portion 34 is provided inside the dummy trench 33, and is provided on an inner side relative to the dummy trench insulating film 32. The dummy trench conductive portion 34 may be formed of the same material as the gate conductive portion 44. An emitter potential may be supplied from an emitter electrode 52 to the dummy trench conductive portion 34.

Figure 3:
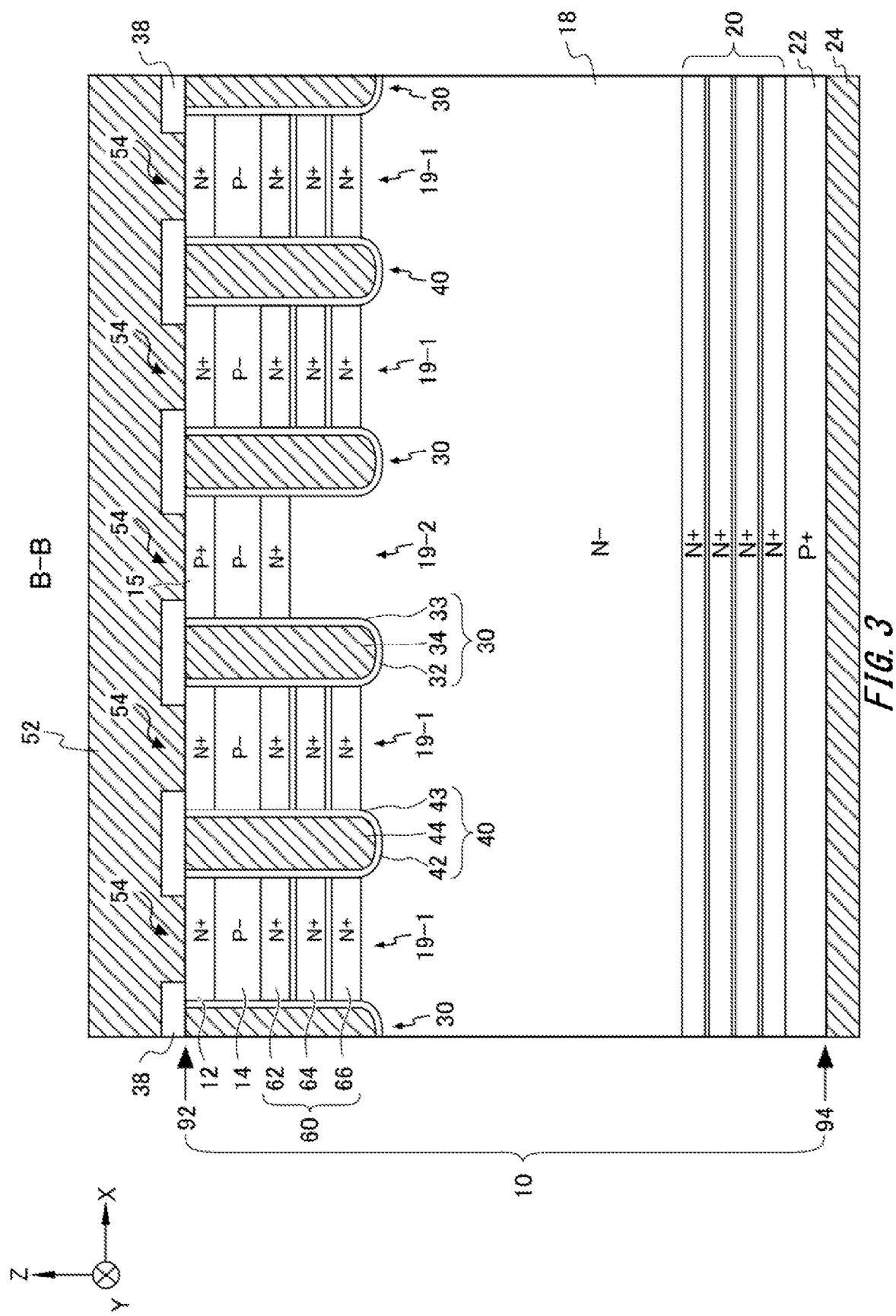
FIG. 3 is a cross-sectional view showing one example according to the B-B cross section in FIG. 1.

FIG. 3 is a cross-sectional view showing one example according to the B-B cross section in FIG. 1. The B-B cross section is an X-Z cross section that passes through the emitter region 12. In FIG. 3, an interlayer insulating film 38, an emitter electrode 52, and a collector electrode 24 are additionally shown. In FIG. 3, the gate trench portions 40 and the dummy trench portions 30 are covered by an interlayer insulating film 38 in the upper surface 92 of the semiconductor substrate 10. The interlayer insulating film 38 electrically insulates the gate conductive portion 44 and the dummy trench conductive portion 34 from the emitter electrode 52. Note that, as described above, the dummy trench conductive portion 34 is electrically connected to the emitter electrode 52 through the contact holes 56 provided in the interlayer insulating film 38.

The emitter electrode 52 is in contact with the upper surface 92 of the semiconductor substrate 10 and is in contact with the interlayer insulating film 38. The collector electrode 24 is in contact with below the lower surface 94 of the semiconductor substrate 10. The emitter electrode 52 and the collector electrode 24 are formed of a conductive material such as metal.

Figure 4:
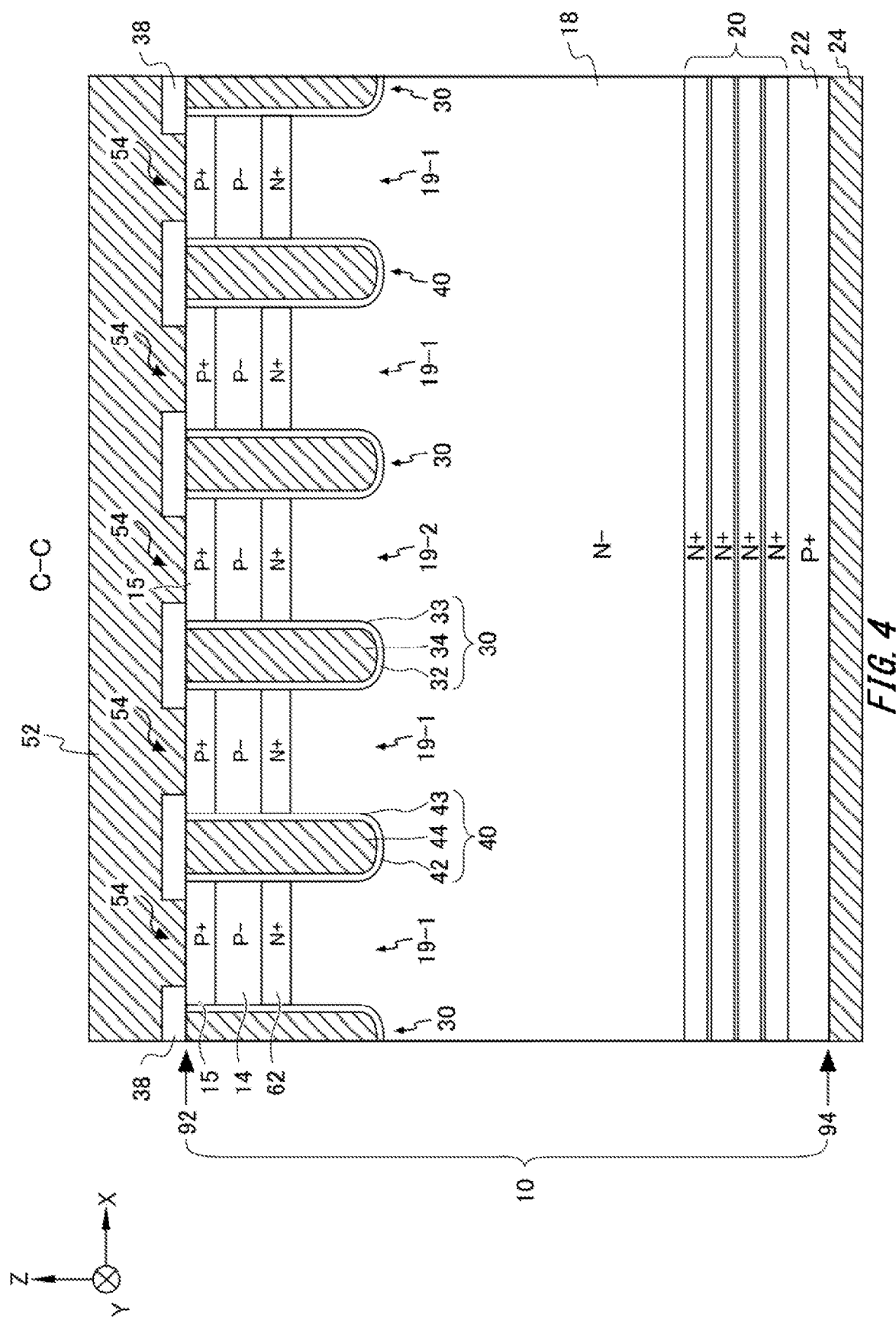
FIG. 4 is a cross-sectional view showing one example according to the C-C cross section in FIG. 1.

FIG. 4 is a cross-sectional view showing one example according to the C-C cross section in FIG. 1. The C-C cross section is an X-Z cross section that passes through the contact region 15 of the mesa portion 19-1, and passes through the region between the two second accumulation regions 64R and the region between the two third accumulation regions 66R. Therefore, in the C-C cross section, only the first accumulation layer 62 is shown, and the second accumulation layer 64 and the third accumulation layer 66 are not shown.

Figure 5:
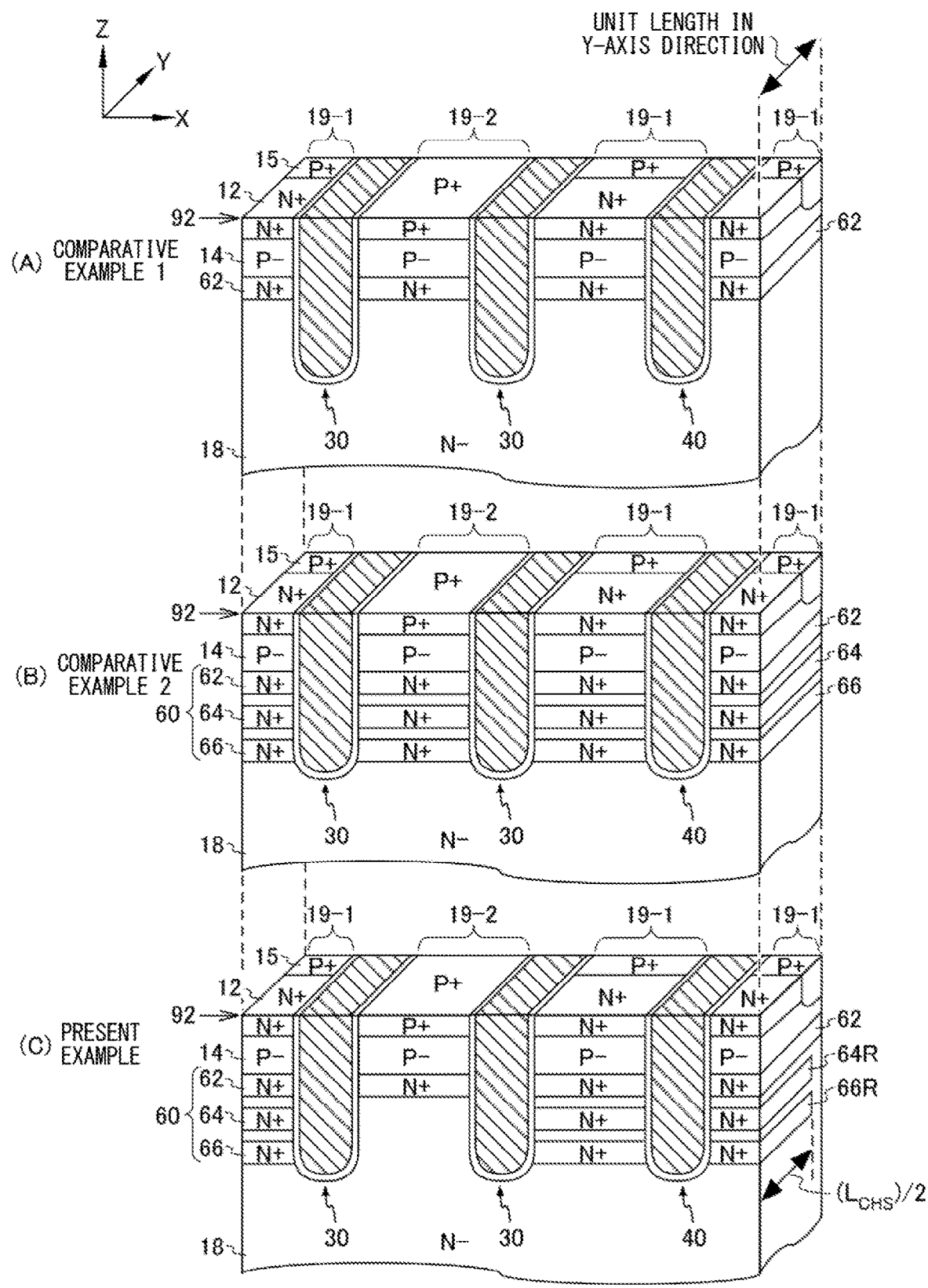
FIG. 5 is a diagram, where (A), (B), and (C) are perspective views of Comparative Example 1, Comparative Example 2, and the first embodiment in a unit structure length in the Y-axis direction, respectively.

FIG. 5 is a diagram, where (A), (B), and (C) are perspective views of Comparative Example 1, Comparative Example 2, and the first embodiment in a unit structure length in the Y-axis direction, respectively. FIG. 5 corresponds to the A-A cross section of the first embodiment (FIG. 2). That is, in FIG. 5, two adjacent dummy trench portions 30 and one gate trench portion 40 are shown.

(A) shows Comparative Example 1 that has only the first accumulation layer 62. In contrast, (B) shows Comparative Example 2 in which the plurality of accumulation layers 60 have three accumulation layers, and all the layers are continuous in the extending direction. And, (C) shows the the present example, which is the first embodiment.

The unit structure length in the Y-axis direction may be half of the sum of the length of the emitter region 12 and the length of the contact region 15 in the Y-axis direction. In the present example, the unit structure length in the Y-axis direction is 1.4 [μm]. It goes without saying that the unit structure length in the Y-axis direction of the present example is nothing more than one example, and may be variously changed depending on designs and specifications. Note that, $(L_{CHS})/2$ in (C) means half of the length in the Y-axis direction of the accumulation region of the present example.

Figure 6A:
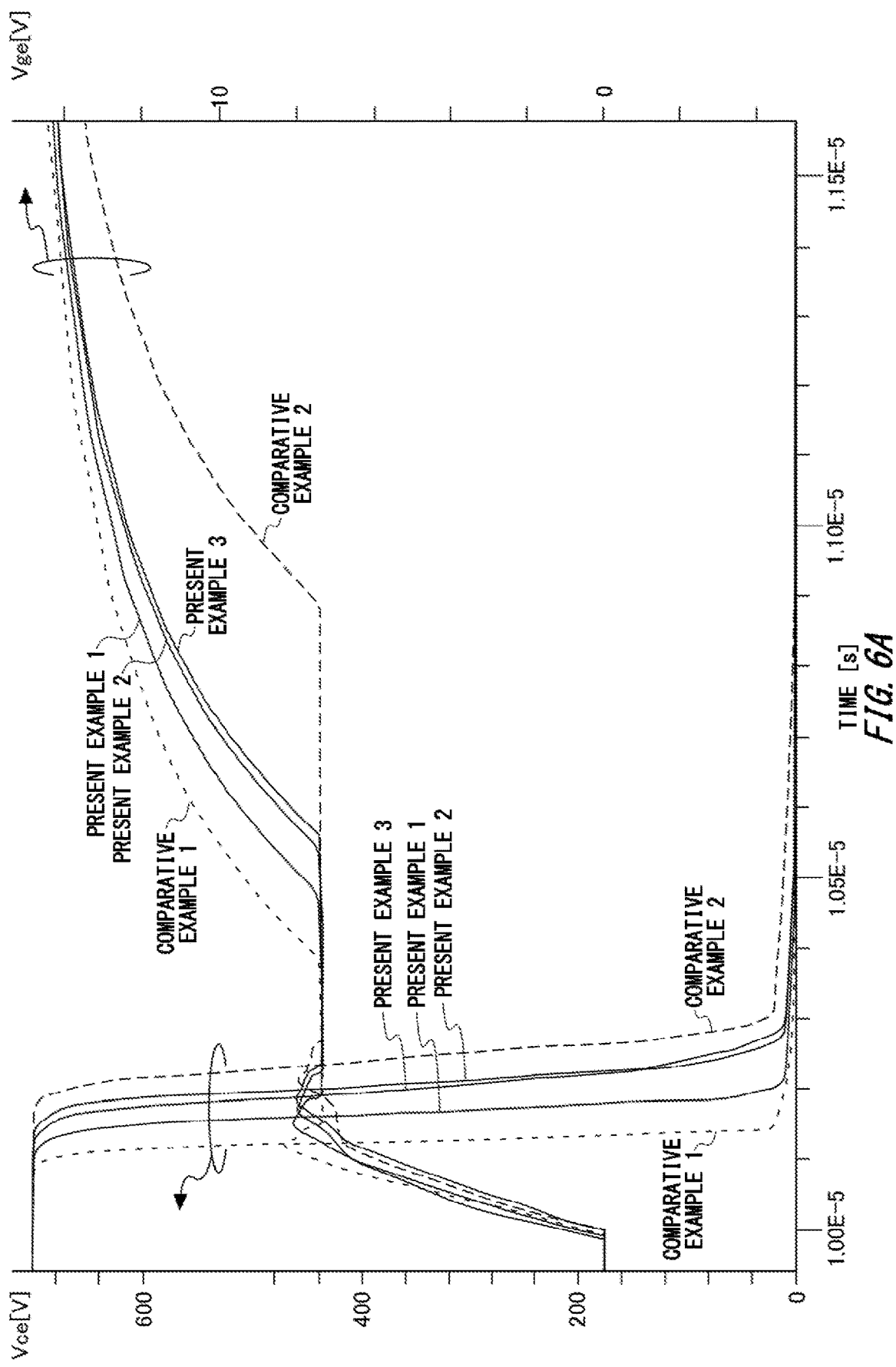
FIG. 6A is a diagram showing a simulation of Vge and Vce when turning on the low current.

FIG. 6A is a diagram showing a simulation of Vge and Vce when turning on the low current. The vertical axis on the left side is Vce [V], and the vertical axis on the right side is Vge [V]. The horizontal axis is time [s]. Vge is a potential difference between the gate metal layer 50 and the emitter electrode 52, and Vce is a potential difference between the collector electrode 24 and the emitter electrode 52. In the present example, the emitter electrode 52 is grounded.

Vge and Vce in (A) of FIG. 5 (that is, Comparative Example 1) are indicated by dotted lines, and Vge and Vce in (B) of FIG. 5 (that is, Comparative Example 2) are indicated by dashed lines. Also, Vge and Vce in (C) of FIG. 5 (that is, the present example) are indicated by solid lines. Note that, in the present example, the case in which $L_{CHS}/2=0.2$ [μm] (the present example 1), 0.6 [μm] (the present example 2), 1.0 [μm] (the present example 3) are shown.

As shown in FIG. 6A, at the time 1.00E-5 [s], a positive potential is applied to the gate metal layer 50. Vge in Comparative Example 1 once rose to approximately 8.0 [V], and then settled to approximately 7 [V] by the time 1.03E-5 [s]. The instantaneously increase in Vge in this manner is referred to as "instantaneous increase (rapid spike)" hereinafter. Vge in Comparative Example 1 remained approximately 7 [V] by the time 1.04E-5 [s], and after the time 1.04E-5 [s], the potential gradually rose. Note that, Vge of Comparative Example 1 temporarily settles to a constant value of approximately 7 [V], and this period in which Vge is a constant value is referred to as a mirror period.

The magnitude (absolute value) of the voltage decrease rate dV/dt of the Vce in Comparative Example 1 is approximately 23000 [V/μs] from the time 1.01E-5 [s] to the time 1.02E-5 [s]. Vce maintains this dV/dt approximately until it falls below 40 [V].

Vge in Comparative Example 2 once rapidly spoke to approximately 8.0 [V], and then settled to approximately 7 [V] by the time 1.03E-5 [s]. Note that, the rapid spike value of Vge in Comparative Example 2 was lower than that in Comparative Example 1. Also, in Comparative Example 2, dV/dt with Vce being 200 [V] or less was approximately 8800 [V/μs], which is ⅓ or less of Comparative Example 1.

Vge in the present example also once rapidly spoke to approximately 8.0 [V], and then settled to approximately 7 [V] by the time 1.03E-5 [s]. Note that, in the present example, dV/dt of Vce was the value each close to those of Comparative Example 2, from approximately 1.015E-5 [s] at which the voltage begins to fall at the maximum decrease rate to approximately 1.02E-5 [s]. After that, the magnitude of dV/dt gradually decreased.

In this manner, in the present example and Comparative Example 2, dV/dt could be suppressed compared to Comparative Example 1. The larger the absolute value of dV/dt is, the greater the electromagnetic noise which is generated in the semiconductor device 100 is. The present example and the comparative example 2 are also advantageous compared to Comparative Example 1 in that electromagnetic noise derived from dV/dt can be reduced.

The main part of the current at the initial period when turning on the low current is the electron current, rather than the hole current. The initial period when turning on the low current is a period from the time immediately before the gate voltage Vge reaches the threshold voltage to the time before entering the mirror period in which Vge is almost constant at the value of the threshold voltage. When Vge becomes nearly the threshold voltage, a channel begins to be formed in the base region 14, and electrons begin to be implanted into the drift layer 18. Therefore, when Vge becomes nearly the threshold voltage, Vce begins to fall sharply.

When the electrons implanted into the drift layer 18 reach the collector layer 22, holes are began to be implanted from the collector layer 22 to the buffer layer 20 and the drift layer 18. The holes concentrate at the lower end of each of the gate trench portion 40 and the dummy trench portion 30. Note that, because the dummy trench conductive portion 34 has the same potential as the emitter electrode 52, holes concentrate particularly near the dummy trench portion 30. That is, near the dummy trench portions 30, a hole inversion layer is formed.

The holes are accumulated at the lower ends from the dummy trench portions 30 to the gate trench portion 40. Derived from this hole distribution, when turning on the low current, a displacement current flows to the vicinity of the lower end of the gate trench portions 40.

The displacement current derived from the accumulation of the holes charges the gate conductive portion 44. This charging of the gate conductive portion 44 is thought to cause the rapid spike of Vge. Because the larger the displacement current is, the more quickly the gate conductive portion 44 is charged, so the potential of the gate conductive portion 44 rises more quickly. As a result, the potential of the gate conductive portion 44 instantaneously exceeds the gate threshold. Thereby, implantation of a large amount of electrons and holes begins, and the current between the collector and the emitter increases.

The voltage decrease rate of Vce (dV/dt) increases depending on the current change rate due to the increase in the current between the collector and the emitter. The larger the displacement current is, the larger the current change rate becomes. Thereby, dV/dt becomes large.

The number of accumulation layers in Comparative Example 1 is smaller than those in Comparative Example 2 and the present example. However, as a result of the sufficient accumulation of carriers in the dummy trench portion 30 as described above, among the three examples of Comparative Example 1, Comparative Example 2, and the present example, the displacement current of Comparative Example 1 is the largest. Therefore, Comparative Example 1 has the largest dV/dt among the three examples. Also, it can be thought to increase the gate resistance Rg in order to suppress dV/dt. However, it is not desirable because when increasing Rg, the turn-on loss Eon increases.

In contrast, in Comparative Example 2 and the present example, a plurality of accumulation layers are provided from directly below the base region 14 to the vicinity of the bottom portion of the dummy trench portions 30. Thereby, compared to Comparative Example 1, this makes it possible to suppress the dense concentration of holes on the side portions of the dummy trench portions 30. Note that, near the bottom portions of the dummy trench portion 30, the holes are densely concentrated similar to Comparative Example 1. Note that, in Comparative Example 2 and the present example, the number of carriers concentrating on the bottom portions and the side portions of the dummy trench portions 30 is smaller than that in Comparative Example 1. As a result, the displacement current that flows in the gate conductive portion 44 in Comparative Example 2 and the present example is sufficiently smaller that that in Comparative Example 1. Thereby, in Comparative Example 2 and the present example, dV/dt can be made smaller compared to Comparative Example 1.

Comparative Example 2 has accumulation layers continuously in the extending direction of the trench portions in the mesa portions 19-1 and 19-2. In contrast, in the mesa portion 19-1 of the present example, the side portions of the dummy trench portions 30 are exposed to the gate trench portions 40. That is, in Comparative Example 2, carriers which have been accumulated by the plurality of continuous accumulation layers 60 can form the displacement current, and in the present example, the exposed side portion of the dummy trench portion 30 can form the displacement current. By adjusting the length of $L_{CHS}$ of the present example, dV/dt can be made smaller compared to Comparative Example 2 in some cases, which will be described below in detail.

In addition, in the present example, the second accumulation layer 64 and the third accumulation layer 66 are provided in a discrete manner directly below a part of the contact region 15 in the mesa portion 19-1. Therefore, when turning off, the carriers pass between the two adjacent second regions 64R and between the two adjacent third regions 66R, and are discharged from the mesa portion 19-1 to the contact region 15 more compared to the Comparative Example 2. Also, the carriers are discharged from the mesa portion 19-2 to the contact region 15 more compared to Comparative Example 2. Therefore, the present example can reduce Eoff compared to Comparative Example 2.

Note that, the mesa portion 19-2 in the present example has only the first accumulation layer 62 as an accumulation layer or an accumulation region. Note that, in another example, the mesa portion 19-2 may have a smaller number of accumulation layers and accumulation regions than the mesa portion 19-1, or a smaller number of accumulation layers or accumulation regions than the mesa portion 19-1. For example, if the mesa portion 19-1 has one accumulation layer and two accumulation regions as in the present example, the mesa portion 19-2 may have one accumulation layer and one accumulation region.

Figure 6B:
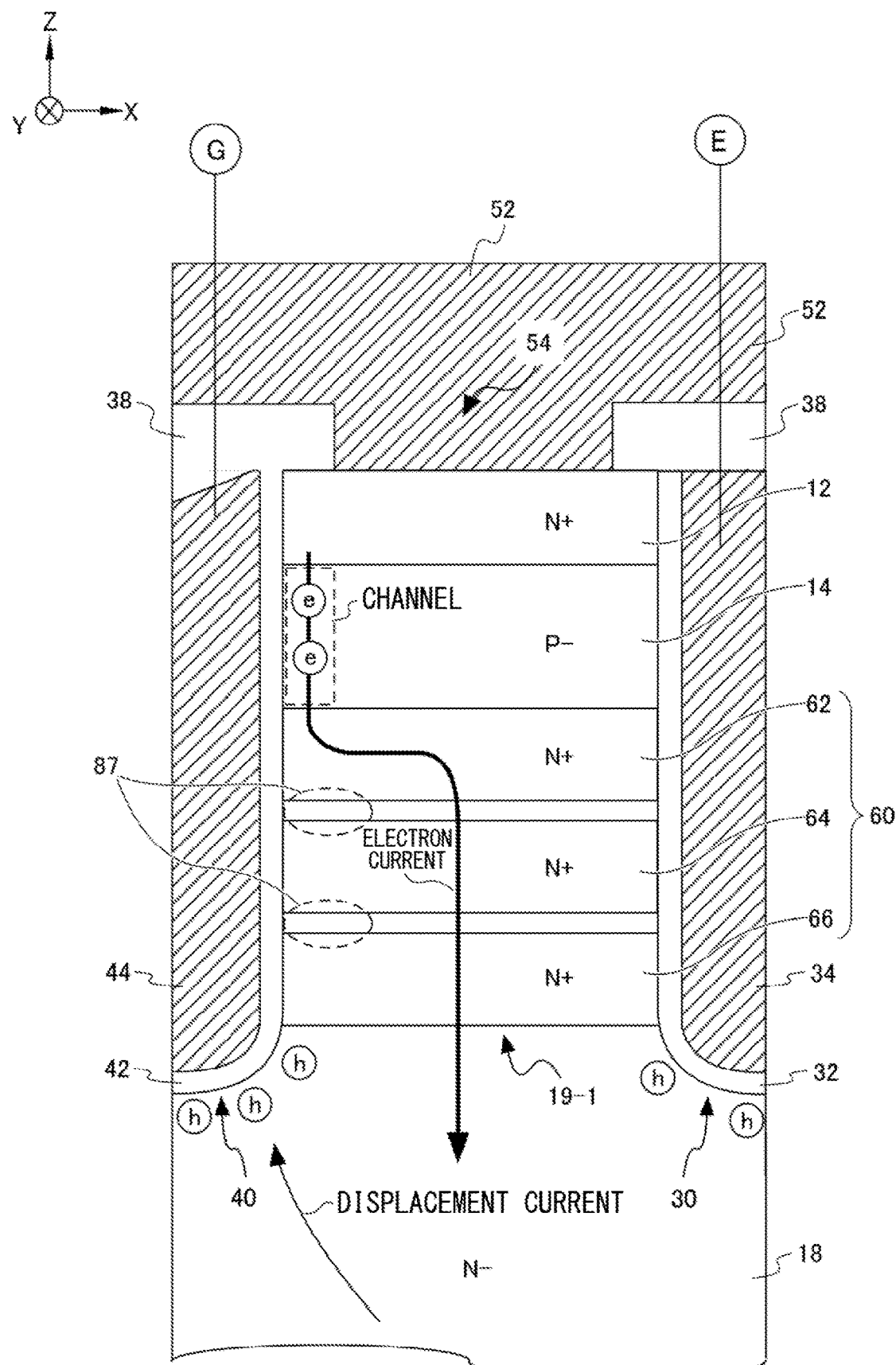
FIG. 6B is a diagram showing an electron current and a displacement current when turning on in the semiconductor device 100 comprising a first accumulation layer 62, a second accumulation layer 64, and a third accumulation layer 66.

FIG. 6B is a diagram showing an electron current and a displacement current when turning on in the semiconductor device 100 comprising a first accumulation layer 62, a second accumulation layer 64, and a third accumulation layer 66. Electrons that have passed through the channel is liable to travel in the array direction (X-axis direction) in the first accumulation layer 62. Note that in the present example, the second accumulation layer 64 and the third accumulation layer 66 are provided below the first accumulation layer 62.

In the present example, the impedance for the electron current is lower in the path that directly flows from the first accumulation layer 62 to the second accumulation layer 64 than in the path that comes back from near the center of the first accumulation layer 62 back to near the gate trench portion 40 and flows to the second accumulation layer 64. Similarly, it is lower in the path that directly flows from the second accumulation layer 64 to the third accumulation layer 66 than in the path that comes back from near the center of the second accumulation layer 64 back to near the gate trench portion 40 and flows to the third accumulation layer 66.

Among between the first accumulation layer 62 and the second accumulation layer 64, and between the second accumulation layer 64 and the third accumulation layer 66, holes are likely to be accumulated in the hole high-concentration region 87 adjacent to the gate trench portion 40. Also, flowing of the electron current near the center of the mesa portion 19 instead of near the gate trench portion 40 enhances accumulation of holes to the hole high-concentration region 87. Thus, flowing of the electron current near the center of the mesa portion 19 is enhanced. In FIG. 6B, the hole high-concentration region 87 in which holes are accumulated is schematically shown, but the hole high-concentration region 87 may exist only near the boundary between the gate trench portion 40 and the semiconductor substrate 10.

As described above, the electron current of the present example proceeds downward around the center of the mesa portion 19 sandwiched between the gate trench portion 40 and the dummy trench portion 30 without coming back to near the gate trench portion 40. That is, the electron current of the present example flows around the center of the mesa portion 19 instead of near the gate trench portion 40. This effect of the electron current flowing around the center of the mesa portion 19 occurs by arraying the first accumulation layer 62, the second accumulation layer 64, and the third accumulation layer 66 in the depth direction.

When the electron current flows around the center of the mesa portion 19, the hole distribution near the bottom portion of the mesa portion 19 is separated around the center of the mesa portion 19. For this reason, the holes on the dummy trench portion 30 side than the path of the electron current do not flow toward the gate trench portion 40 side. This separation of the hole distribution at the central portion of the mesa portion 19 suppresses the accumulation of holes at the lower end of the gate trench portion 40. As a result, the displacement current can be reduced. Because the displacement current can be reduced, the charging of the gate conductive portion 44 is also reduced, and the instantaneous increase of the gate voltage Vge is also suppressed. This can suppress the voltage decrease rate (dV/dt) between the collector electrode 24 and the emitter electrode 52.

The hole distribution in the example of FIG. 6B is thought to be derived from the fact that the hole distribution between the gate trench portion 40 and the dummy trench portion 30 has been separated by the electron current. Also, derived from the hole distribution, when turning on, the displacement current flowing from near the lower end of the dummy trench portion 30 to near the lower end of the gate trench portion 40 can be reduced.

Note that, the second accumulation layer 64 and the third accumulation layer 66 may not be in contact with the dummy trench portion 30. In this case, the holes can exist from the lower end of the dummy trench portion 30 to directly below the first accumulation layer 62 in the side portion of the dummy trench portion 30. If the second accumulation layer 64 and the third accumulation layer 66 are not in contact with the dummy trench portion 30, extraction of holes to the emitter electrode 52 when turning off can be enhanced.

FIG. 6C is a diagram showing waveform examples of a collector current Ic when turning on. Waveform 103 shows the collector current Ic when none of the first accumulation layer 62, the second accumulation layer 64, and the third accumulation layer 66 is provided. Waveform 104 shows the collector current Ic when neither the second accumulation layer 64 nor the third accumulation layer 66 is provided, and the first accumulation layer 62 is provided. Because the first accumulation layer 62 is provided near the base region 14, this increases the negative capacitance between the gate and the collector. For this reason, di/dt of the collector current Ic when turning on increases. By providing the first accumulation layer 62 without providing the second accumulation layer 64 and the third accumulation layer 66, the trade-off between the ON voltage and the turn-off loss can be improved. Note that, if only the first accumulation layer 62 is provided, di/dt when turning on increases compared to the case of providing the first accumulation layer 62, the second accumulation layer 64, and the third accumulation layer 66. Note that, if it is attempted to suppress the di/dt increase by increasing the gate resistance in order to cope with this, the turn-on loss increases.

Waveform 101 shows the collector current Ic when the second accumulation layer 64 is not provided, and the first accumulation layer 62 and the third accumulation layer 66 are provided. Because the third accumulation layer is provided at a position away from the base region 14, this increases the capacitance between the gate and the collector. For this reason, di/dt of the collector current Ic when turning on decreases. Therefore, the turn-on loss can be reduced while improving the trade-off between the ON voltage and the turn-off loss.

Waveform 102 shows the collector current Ic when the first accumulation layer 62, the second accumulation layer 64, and the third accumulation layer 66 are provided. By providing the second accumulation layer 64, the capacitance between the gate and the collector further increases. For this reason, the turn-on loss can be further reduced while improving the trade-off between the ON voltage and the turn-off loss.

Figure 7:
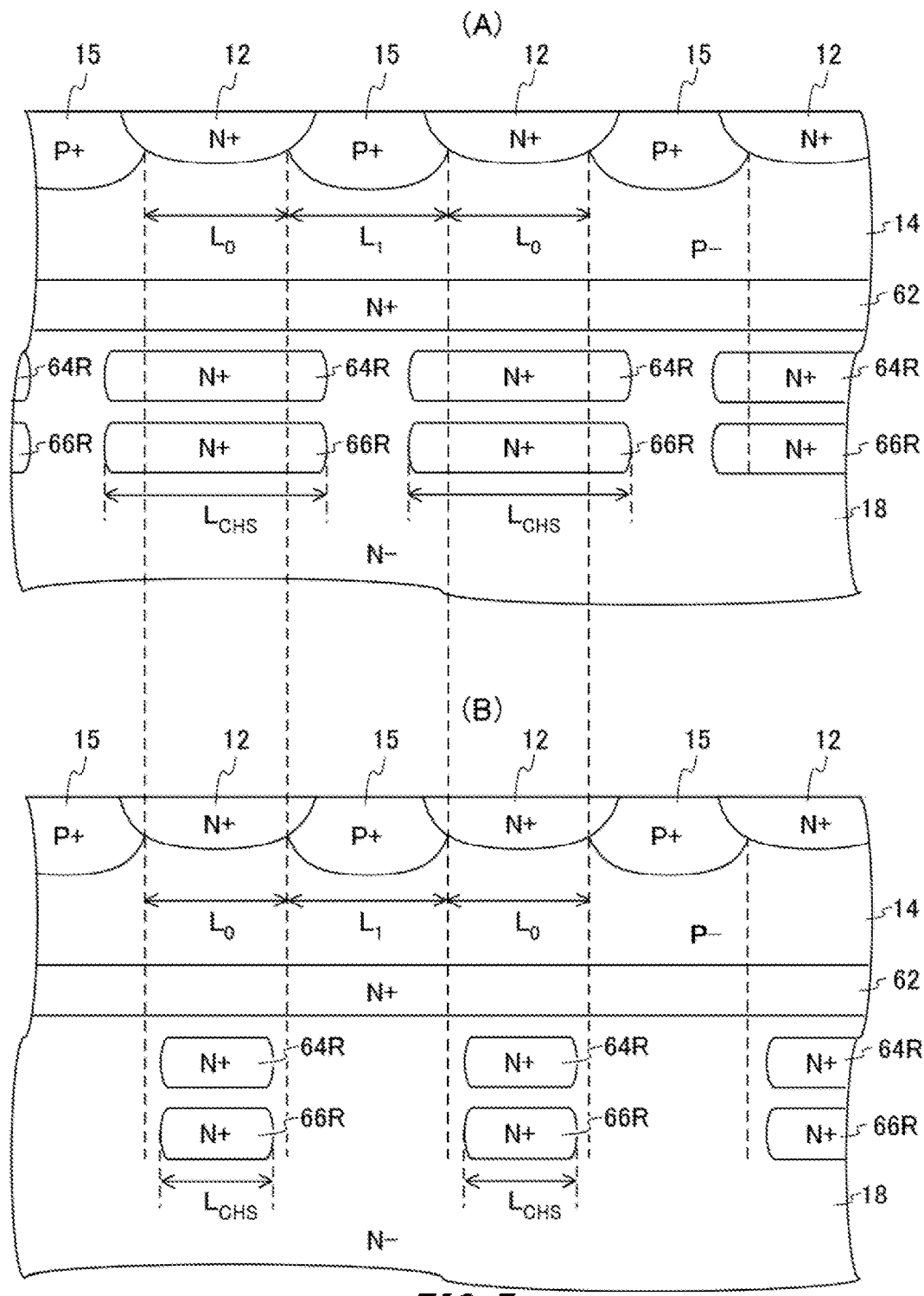
FIG. 7 is a diagram, where (A) and (B) show the Y-Z plane in FIG. 2.

FIG. 7 is a diagram, where (A) and (B) show the Y-Z plane in FIG. 2. The relationship in (A) between the each length $L_0$ of the bottom region of the emitter region 12 in the extending direction of the trench portion and the each of a plurality of length $L_{CHS}$ of each of the plurality of accumulation regions in the extending direction is different from that in (B). Note that, The bottom region of the emitter region 12 of the present example is a region that, in the semiconductor substrate 10, is not in direct contact with the contact region 15, and is in direct contact with the base region 14.

Also, in the present example, a region that, in the semiconductor substrate 10, is not in direct contact with the emitter region 12, and is in direct contact with the base region 14, is the bottom region of the contact region 15. In the present example, the length in the Y-axis direction of the bottom region of the contact region 15 is described as $L_1$. Note that, in one example, $L_0$=1.1 [µm] and $L_1$=1.7 [µm], but it goes without saying that the values of $L_0$ and $L_1$ may be changed variously depending on the design and the specification.

In (A), the length $L_{CHS}$ of the accumulation region is longer than the length $L_0$ of the bottom region. That is, in the direction from the lower surface 94 to the upper surface 92, the second accumulation region 64R and the third accumulation region 66R cover the emitter region 12. In the example of (A), $L_{CHS}/L_0$ is larger than 1. Because the larger the $L_{CHS}/L_0$ is, the more easily the carrier can be accumulated, the Von can be made smaller.

In contrast, in (B), the length $L_{CHS}$ of the accumulation region is shorter than the length $L_0$ of the bottom region. That is, in the depth direction from the upper surface 92 to the lower surface 94, the emitter region 12 covers the second accumulation region 64R and the third accumulation region 66R. In the example of (B), $L_{CHS}/L_0$ is smaller than 1. Because the smaller the $L_{CHS}/L_0$ is, the more easily the carrier can be discharged to the contact region 15, the Eoff can be made smaller. Note that, as shown in FIG. 7, end portions of the second accumulation region 64R and the third accumulation region 66R in the extending direction (Y direction) may be curved surface-shaped such as a spherical surface. As described above, the second accumulation layer 64 and the third accumulation layer 66 are formed by selectively ion-implanting an n-type dopant. In this ion implantation, the doping concentration distribution at the end portion shielded by the resist mask follows the Gaussian distribution. For this reason, the end portion shielded by the resist mask can be a curved surface instead of a rectangular shape.

Figure 8:
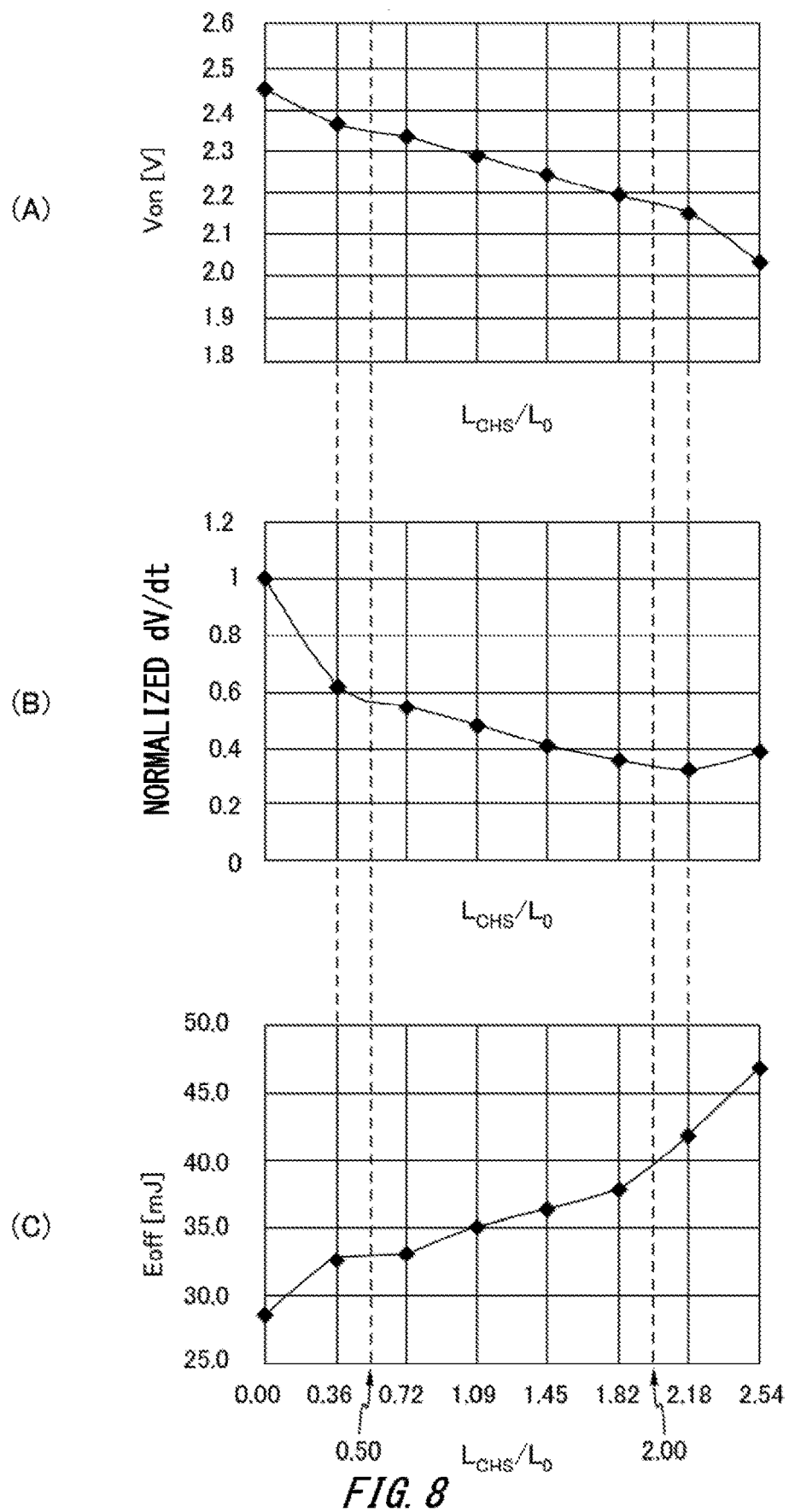
FIG. 8 is a diagram, where (A) is a simulation result showing Von with respect to $L_{CHS}/L_0$.

FIG. 8 is a diagram, where (A) is a simulation result showing Von with respect to $L_{CHS}/L_0$. (B) is a simulation result showing dV/dt with respect to $L_{CHS}/L_0$. (C) is a simulation result showing Eoff with respect to $L_{CHS}/L_0$. The horizontal axes of (A), (B), and (C) are common, they are $L_{CHS}/L_0$. The vertical axis of (A) is Von[V]. The vertical axis of (B) is the value of dV/dt each normalized by the value of dV/dt in the case in which $L_{CHS}$=0 (that is, in the above-mentioned Comparative Example 1). The vertical axis of (C) is Eoff [mJ].

Note that, $L_{CHS}/L_0$=0 corresponds to the above-mentioned Comparative Example 1, and $L_{CHS}/L_0$=2.55 corresponds to the above-mentioned Comparative Example 2. The values between both correspond to the above-mentioned present example. As shown in (A), the larger the $L_{CHS}/L_0$ is, the smaller the Von is. This is apparent from the fact that the more the $L_{CHS}/L_0$ increases, the larger the area of the accumulation region in one accumulation layer is.

As shown in (B), the dV/dt is the highest at $L_{CHS}/L_0$=0. This is thought to be derived from the above-mentioned displacement current. In contrast, the larger the $L_{CHS}/L_0$ is, the smaller the dV/dt is. Note that, it rises slightly at $L_{CHS}/L_0$=2.55. The dV/dt at $L_{CHS}/L_0$=2.55 is approximately the same as dV/dt at $L_{CHS}/L_0$=1.82. That is, it is quantitatively apparent that dV/dt can be made smaller when having at least one separated accumulation layer directly below the contact region 15 like the present example than Comparative Example 2.

Also, as shown in (C), the smaller the $L_{CHS}/L_0$ is, the smaller the Eoff is. This is because the smaller the $L_{CHS}/L_0$ is, the weaker the accumulation effect of the carrier becomes, so tail currents generated when turning off decreases, thereby reducing the turn-off loss.

The $L_{CHS}/L_0$ of the the present example may be 0.36 or more, and may be 0.4 or more. Also, the $L_{CHS}/L_0$ may be 2.5 or less, and may be 2.2 or less. Note that, $L_{CHS}/L_0$ may be smaller than $\{1+(L_1/L_0)\}$. In one example, the $L_{CHS}/L_0$ may satisfy $0.5 \leq L_{CHS}/L_0 \leq 2$. Thereby, Von and dV/dt can be reduced compared to Comparative Example 1, and Eoff can be reduced compared to Comparative Example 2.

Furthermore, the $L_{CHS}/L_0$ may satisfy $1.45 < L_{CHS}/L_0 < 2.54$, and may satisfy $1.82 \leq L_{CHS}/L_0 < 2.54$. Thereby, in addition to the respective advantages of Von and dV/dt compared to Comparative Example 1, and Eoff compared to Comparative Example 2, dV/dt can also be reduced compared to Comparative Example 2.

FIG. 9 is a simulation result showing Eoff with respect to Vce. The horizontal axis shows the saturation voltage between the collector and the emitter Vce (sat.) [V] when the IGBT is ON. The vertical axis shows Eoff [mJ]. Each dot in FIG. 9 corresponds to each dot of (A) to (C) in FIG. 5. The dot positioned at the bottommost in FIG. 9 corresponds to Comparative Example 1 ((A) in FIG. 5, $L_{CHS}/L_0$=0). The dot positioned at the uppermost in FIG. 9 corresponds to Comparative Example 2 ((B) in FIG. 5, $L_{CHS}/L_0$=2.54).

Six dots which are positioned between the dot corresponding to Comparative Example 1 and the dot corresponding to Comparative Example 2 correspond to the present example ((C) of FIG. 5). Among the six dots of the present example, the $L_{CHS}/L_0$ shown in FIG. 8 increases in the order from the bottom to the top. Note that, each line segment passing through each dot is a calculated value of Eoff in the case where Vce (sat.) is changed by changing the concentration of the collector layer 22 in each example.

Generally, there is a trade-off relationship between Vce (sat.) and Eoff. For example, in Comparative Example 1, Eoff is relatively low, but Vce (sat.) is relatively high. In contrast, in Comparative Example 2, Vce (sat.) is relatively low, but Eoff is relatively high. In the present example, by moderately reducing Vce (sat.) and Eoff, the trade-off between both can be improved.

FIG. 10 is a flowchart showing one example of a manufacturing method of the semiconductor device 100. At first in Step S100, an upper surface structure near the upper surface 92 of the semiconductor substrate 10 is formed. Step S100 includes a dopant implantation region forming step of forming an emitter region 12 and a base region 14. The base region 14 may be formed by implanting dopant such as phosphorus. Also, Step S100 includes a trench portion forming step of forming each trench portion after the dopant implantation region forming step. Also, Step S100 includes an interlayer insulating film forming step of forming an interlayer insulating film 38, which covers each trench portion.

Then, in Step S110, barrier metal is formed above the entire semiconductor substrate 10 and interlayer insulating film 38. Then, in Step S120, protons or phosphorus is implanted from the upper surface 92 of the semiconductor substrate 10 to form the second accumulation layer 64 and the third accumulation layer 66. In S120, protons are implanted a plurality of times with different range of implanting protons. A part of the implanted protons is converted to donors to form the second accumulation layer 64 and the third accumulation layer 66. In this case, hydrogen is contained as a dopant in the second accumulation layer 64 and the third accumulation layer 66. Also, in Step S120, protons may be implanted from the lower surface 94 of the semiconductor substrate 10.

Protons can be easily implanted to a deep position compared to phosphorus ions and the like, and variations in implanting position are also small. By using protons, the accumulation layer can be formed more easily compared to when using phosphorus. Also, because the peak of the doping concentration distribution of the accumulation layer can be steeply formed, an accumulation layer having a narrow depth width can be easily formed. Also, by implanting protons from the upper surface 92 of the semiconductor substrate 10 after forming the barrier metal, protons or hydrogen can be suppressed from escaping from the upper surface 92 of the semiconductor substrate 10.

Then, in Step S122, resist is applied to the upper surface 92 of the semiconductor substrate 10, and the resist is patterned into a predetermined shape. Then, in Step S124, protons or phosphorus is implanted into the semiconductor substrate 10 in order to form the first accumulation layer 62. In the present example, protons are implanted. Then, in Step S126, phosphorus or protons is activated by performing annealing at a temperature of approximately 800 degrees C. to 1000 degrees C. in the case of phosphorus, and at a temperature of approximately 350 degrees C. to 450 degrees C. in the case of protons. In the present example, the annealing is performed at a temperature in a range corresponding to protons.

Then, in Step S130, the emitter electrode 52 is formed. The emitter electrode 52 may be formed by sputtering. In sputtering, the temperature of the semiconductor substrate 10 may be approximately from 350 degrees C. to 450 degrees C. Therefore, annealing after implantation of protons may be omitted, and instead of that, protons may be activated when forming the emitter electrode 52. Note that, the order of step S120 and step S130 may be swapped with each other. By implanting protons after forming the emitter electrode 52, protons can be further suppressed from escaping from the upper surface of the semiconductor substrate 10. Also, after forming the emitter electrode 52, the carrier lifetime may be adjusted by irradiating the semiconductor substrate 10 with helium ions or electron beams.

Then in step S140, the surface opposite to the upper surface 92 of the semiconductor substrate 10 is ground to adjust the thickness of the semiconductor substrate 10. The thickness of the semiconductor substrate 10 is set depending on the breakdown voltage that the semiconductor device 100 should have.

Then, in Step S150, a lower surface structure near the lower surface 94 of the semiconductor substrate 10 is formed. The lower surface structure is, for example, a collector layer 22. Then, in Step S160, protons is implanted from the lower surface 94 of the semiconductor substrate 10 to form the buffer layer 20. Then, in Step S170, the semiconductor substrate 10 is annealed to activate proton implanted into the buffer layer 20.

Protons may be implanted a plurality of times into the buffer layer 20 with different depth positions. This can form a plurality of peaks in the doping concentration distribution in the depth direction of the buffer layer 20. In the doping concentration distribution of the buffer layer 20, the peak value at the deepest position seen from the lower surface 94 of the semiconductor substrate 10 is larger than the peak value at the second deepest position. The semiconductor device 100 can be manufactured by such a method.

In an example of another manufacturing method, phosphorus may be used as dopant of the first accumulation layer 62. In this case, in Step S100, dopant may be implanted to form the first accumulation layer 62. Because the first accumulation layer 62 is formed in a relatively shallow position, it can be formed with phosphorus. In contrast, the second accumulation layer 64 and the third accumulation layer 66 are formed in relatively deep position. By making the dopant of the second accumulation layer 64 and the third accumulation layer 66 hydrogen, the second accumulation layer 64 and the third accumulation layer 66 can be easily formed, and the width in the depth direction can be narrowed as well.

Also, in another manufacturing method, phosphorus may be used as at least one dopant of the second accumulation layer 64 and the third accumulation layer 66. For example, the dopant of the second accumulation layer 64 closest to the first accumulation layer 62 is phosphorus. In this case, in Step S100, dopant may be implanted at a position of the second accumulation layer 64. In step S100, after implanting phosphorus into the base region 14, annealing at larger than or equal to 1000 degrees C. and less than or equal to 1200 degrees C., for example, at approximately 1150 degrees C. may be performed for approximately 3 hours.

Then, phosphorus is implanted at a position of the first accumulation layer 62 and the third accumulation layer 66. At this time, the valence of phosphorus ions to be implanted into a deeper position may be made higher. This can implant phosphorus ion into a deep position without improving the accelerating voltage so much. After implanting phosphorus, annealing at low temperature and for a short time is performed compared to annealing of the base region 14. Annealing is performed at larger than or equal to 900 degrees C. and less than or equal to 1100 degrees C., for example, at approximately 1000 degrees C. for approximately 30 minutes. Other steps are similar to the step shown in FIG. 10.

FIG. 11A is a diagram showing the Y-Z plane in FIG. 2 according to a first modification example. In the present example, the second accumulation layer 64 is provided continuously in the extending direction of the trench portion. The present example is different from the first embodiment in this point.

FIG. 11B is a diagram showing the Y-Z plane in FIG. 2 according to a second modification example. In the present example, the first accumulation layer 62 and the third accumulation layer 66 are provided below at least a part of the emitter region 12, but are not provided below a partial region of the contact region 15. In this manner, in the present example, the first accumulation layer 62 is an island-like accumulation layer including a plurality of first accumulation regions 62R. Also, in the present example, the second accumulation layer 64 is provided continuously in the extending direction of the trench portion. The present example is different from the first embodiment in those points.

FIG. 11C is a diagram showing the Y-Z plane in FIG. 2 according to a third modification example. In the present example, the first accumulation layer 62, the second accumulation layer 64, and the third accumulation layer 66 are provided below at least a part of the emitter region 12, but are not provided below a partial region of the contact region 15. In this manner, in the present example, all the accumulation layers are island-like accumulation layers including a plurality of accumulation regions.

Also in in the examples of FIGS. 11A to 11C, the advantageous effects described in FIGS. 1 to 10 can be obtained. Note that, if the bottom region of each accumulation region 62R, 64R and 66R has the length of the $L_{CHS}$ described above, the similar result as the simulation result in the numerical range of $L_{CHS}/L_0$ described above may be obtained. Also in FIGS. 11A to 11C, examples in which there are three accumulation layers are shown, but the present examples may also be applied to a case where there are three or more accumulation layers.

FIG. 12 is a perspective view corresponding to the A-A cross section in FIG. 1 according to a second embodiment. In the present example, no accumulation layer is provided in the mesa portion 19-2 between the two dummy trench portions 30 in the transistor section 70. That is, in the mesa portion 19-2 of the transistor section 70 of the present example, none of the second accumulation layer 64 and the third accumulation layer 66 are provided, in addition to that, the first accumulation layer 62 is not also provided. In this manner, the carriers can be more efficiently extracted when turning off IGBT compared to the first embodiment where there is an first accumulation layer 62 provided in the mesa portion 19-2. This can further reduce Eoff. The present example is the same as the first embodiment in other points, and it is possible to obtain the same advantageous effect in the present example as the first embodiment.

FIG. 13 is a diagram partially showing an upper surface of a semiconductor device 100 according to a third embodiment. The emitter region 12 of the present example includes a stripe-shaped portion extending parallel to the extending direction and a portion extending in the array direction. A plurality of portions extending in the array direction are provided at equal intervals being spaced apart in the extending direction. In this manner, a plurality of contact regions 15 are provided at equal intervals being spaced apart from each other in the extending direction. The present example is different from the first embodiment in those points, but it is the same as the first embodiment in other points.

FIG. 14 is a perspective view showing one example according to the D-D cross section in the third embodiment. FIG. 14 corresponds to the perspective view in FIG. 2. Also in the mesa portion 19-1 of the present example, at least one accumulation layer that is among a plurality of accumulation layers 60 is provided below at least a part of the emitter region 12, but are not provided below a partial region of the contact region 15. Also, in the mesa portion 19-2, only the first accumulation layer 62 is provided. Also in such a configuration, the same advantageous effects as in the first embodiment can be obtained. Also, the present example and the modification examples (FIGS. 11A to 11C) of the first embodiment, or the second embodiment may be combined.

FIG. 15A is a diagram partially showing an upper surface of a semiconductor device 100 according to a fourth embodiment. In the present example, the diode section 80 is expressed. The present example is different from the first embodiment in this point. The diode section 80 may be a region of the lower surface 94 that coincides with the region, where the cathode layer 82 is provided in the active region, or may be a virtual region obtained by projecting the cathode layer 82 perpendicularly relative to the upper surface 92 in the active region. In the diode section 80 of the present example, a dummy trench portion 30 of the transistor section 70 is provided.

Also, in the transistor section 70 of the present example, a plurality of dummy trench portions 30 are provided at a boundary with the diode section 80. A plurality of mesa portions 19 may be provided in the boundary region of the transistor section 70 between the dummy trench portion 30 positioned at the transistor section 70 side end portion of the diode section 80 and the gate trench portion 40 positioned at the diode section 80 side end portion of the transistor section 70. The plurality of mesa portions 19 in the boundary region may include one or more boundary mesa portions 19-3. In the boundary region of the present example, three mesa portions 19 are arranged. Among the three mesa portions 19, one is a mesa portion 19-1 adjacent to the gate trench portion 40, and the other two are boundary mesa portions 19-3.

The boundary mesa portion 19-3 A in the present example includes a boundary mesa portion 19-3A relatively far from the diode section 80 and a boundary mesa portion 19-3B relatively close to the diode section 80. The boundary mesa portion 19-3A in the present example has the same configuration as the mesa portion 19-2. That is, the boundary mesa portion 19-3A has the contact region 15 on the base region 14 (not shown). The contact region 15 is exposed on the upper surface 92. The two trench portions sandwiching the boundary mesa portion 19-3A in the X-axis direction are the dummy trench portions 30. For this reason, the emitter region 12 of the mesa portion 19-1 adjacent to the boundary mesa portion 19-3A is in contact with the dummy trench portion 30 in the X-axis direction. On the other hand, in the boundary mesa portion 19-3B relatively close to the diode section 80, the base region 14 is exposed on an upper surface 92 of the semiconductor substrate 10 similarly to the mesa portion 19-4 of the diode section 80.

In the diode section 80, contact holes 54 are provided above contact regions 15 and base regions 14. The contact holes 54 of the present example are not provided above the base region 14 the most closest to the gate metal layer 50, among a plurality of base regions 14 in the mesa portion 19-4 of the diode section 80. In the present example, the contact holes 54 of the transistor section 70 have the same length in the extending direction as the contact holes 54 of the diode section 80.

The mesa portion 19-4 of the diode section 80 has a P--type base region 14 exposed on the upper surface 92. The contact region 15 is exposed on the upper surface 92 of the mesa portion 19-4 so as to be sandwiched by the base regions 14 along the extending direction on the upper surface 92. Note that, the mesa portion 19 of the diode section 80 may have a plurality of accumulation layers 60, and may not have a plurality of accumulation layers 60. In the present example, the mesa portion 19 of the diode section 80 has one first accumulation layer 62 in the Z-axis direction. Also, similar to the transistor section 70, the first accumulation layer 62 is provided between each dummy trench portion 30, and is provided extending in the extending direction of the trench portion. Furthermore, if the second accumulation layer 64 and the third accumulation layer 66 are provided, the second accumulation layer 64 and the third accumulation layer 66 are provided between each dummy trench portion 30, and may be provided in a discrete manner in the extending direction of the trench portion. Note that, a P-type high concentration region which is shallower than the contact region 15 may be provided near the upper surface of the base region 14, and below the contact hole 54, which is not shown. Such a P-type high concentration region reduces the contact resistance between the base region 14 and the emitter electrode 52. In particular when forming a plug, the effect of reducing the contact resistance is large.

The dummy trench conductive portion 34 in the dummy trench portion 30 of the diode section 80 may be connected to the emitter electrode 52 through the connecting portion 25 and contact holes 56 provided on the connecting portion 25. The connecting portion 25 may be the same material as the connecting portion 21. The contact holes 56 are contact holes provided in the interlayer insulating film 38.

FIG. 15B is a cross-sectional view showing one example according to the E-E cross section in FIG. 15A. The E-E cross section is the X-Z cross section that passes through the emitter region 12. In FIG. 15B, an interlayer insulating film 38, an emitter electrode 52, and a collector electrode 24 are additionally shown.

The diode section 80 has a buffer layer 20 below a drift layer 18. The buffer layer 20 may be a layer common to the transistor section 70. Also, the diode section 80 has an N+-type cathode layer 82 below the buffer layer 20. The cathode layer 82 may be a layer provided at the same depth position as the collector layer 22 of the transistor section 70. In this manner, the diode section 80 may function as a free wheeling diode (Free Wheeling Diode: FWD) that is a power conversion circuit such as an inverter, and flows a free wheeling current conducted in the opposite direction when turning off the transistor section 70 of another semiconductor device.

Below the boundary mesa portion 19-3A and the boundary mesa portion 19-3B, a collector layer 22 exposed on the lower surface 94 of the semiconductor substrate 10 is provided. The collector layer 22 may be a collector layer 22 extending from the transistor section 70. The semiconductor substrate 10 includes, in the diode section 80, a cathode layer 82 exposed on the lower surface 94. Because the collector layer 22 extends until the lower surface 94 of the boundary mesa portion 19-3B, the distance between the emitter region 12 of the mesa portion 19-1 adjacent to the boundary mesa portion 19-3A and the cathode layer 82 of the diode section 80 can be secured. Also, as described above, the emitter region 12 of the mesa portion 19-1 is in contact with the dummy trench portion 30 in the X-axis direction. Thus, electrons implanted from the gate structure portion of the transistor section 70 into the drift layer 18 can be prevented from flowing out to the cathode layer 82 of the diode section 80.

Furthermore, in the present example, the distance between the contact region 15 of the boundary mesa portion 19-3A and the cathode layer 82 of the diode section 80 can be also made longer compared to the case in which the cathode layer 82 is provided directly below the boundary mesa portion 19-3A. In this manner, when the diode section 80 is conducted, holes can be prevented from being implanted from the contact region 15 having a higher doping concentration than the base region 14 into the cathode layer 82.

Note that, the emitter region 12 and the contact region 15 of the present example may be in a stripe shape like the second embodiment. In this case, the the shape of the contact holes 54 and the like may be appropriately changed corresponding to such a deformation. Also, the present example and the modification examples (FIGS. 11A to 11C) of the first embodiment, or the third embodiment may be combined.

FIG. 16 is a diagram showing one example of a doping concentration distribution according to the a-a cross section and the b-b cross section in FIG. 15B. The a-a cross section is a cross section in the mesa portion 19-1 of the transistor section 70, and the b-b cross section is a cross section in the mesa portion 19-4 of the diode section 80.

In each of the plurality of accumulation layers 60 in the transistor section 70 and the first accumulation layer 62 in the diode section 80, the doping concentration distribution in the depth direction of the semiconductor substrate 10 has at least one peak. If a plurality of accumulation layers are formed in the depth direction of the semiconductor substrate 10, in the doping concentration distribution in the depth direction, the accumulation layers have a plurality of peaks (maximum values) and minimum values at the position sandwiched by the plurality of peaks in the depth direction. In other words, a region between a plurality of minimum values may be considered as one accumulation layer. Each of the one or more accumulation layers may be formed by implanting impurities from the upper surface 92 or the lower surface 94.

FIG. 16 shows the doping concentration distribution from the emitter region 12 to the vicinity of the upper end of the drift layer 18. The vertical axis of the diagram showing the doping concentration as in FIG. 16 is a logarithmic axis. One scale on the vertical axis shows 10 times. As used herein, the doping concentration refers to a concentration of dopants converted to donors or acceptors. The doping concentration shown in FIG. 16 corresponds to the concentration difference between the donors and the acceptors.

In the example of FIG. 16, the transistor section 70 has a first accumulation layer 62, a second accumulation layer 64, and a third accumulation layer 66. The doping concentration of the first accumulation layer 62 is D1, the doping concentration of the second accumulation layer 64 is D2, and the doping concentration of the third accumulation layer 66 is D3. Peak values may be used as the values of the doping concentrations D1 to D3 (and D4 described below).

Also, doping concentration Dv at the boundary of each accumulation layer is the minimum value of the doping concentration distribution of the accumulation layer. The doping concentration Dv in the present example is larger than the doping concentration Dd of the drift layer 18. The doping concentration Dv may be $\frac{1}{10}$ or less, and may also be $\frac{1}{100}$ or less of the doping concentration D1.

In the plurality of accumulation layers 60, there may also be a plurality of boundaries of the respective accumulation layers. There may also be a plurality of minimum values of the doping concentration (Dv) at the boundary of the respective accumulation layers. The plurality of minimum values of the doping concentration (Dv) may be values different from each other. In the present example, the two doping concentrations Dv are approximately the same value. The plurality of minimum values of the doping concentration (Dv) may decrease along the depth direction from the upper surface side to the lower surface side.

In the p-n junction between the base region 14 and the first accumulation layer 62, the dopant concentration of the base region 14 (acceptor concentration in the present example) is equal to the dopant concentration of the first accumulation layer 62 (donor concentration in the present example). It is assumed that the acceptor concentration or the donor concentration at this position J1 at which the acceptor concentration and the donor concentration are equal is Dj. The acceptor concentration or the donor concentration Dj at the position J1 may be lower than at least one of the plurality of doping concentration minimum values Dv. In this manner, when the gate voltage exceeds the gate threshold and electrons flow, because the impedance for electrons becomes lower in the mesa portion 19, so that the electron current can flow to the central portion of the mesa portion more easily. Also, The acceptor concentration or the donor concentration Dj at the position J1 may also be higher than at least one of the plurality of doping concentration minimum values Dv. In this manner, even if the integrated concentration along the depth direction of the plurality of accumulation layers 60 becomes too high, increase in the electric field intensity when turning off can be suppressed.

Each mesa portion 19 of the diode section 80 in the present example has one accumulation layer (first accumulation layer 62). The doping concentration of the first accumulation layer 62 is D4. Note that, the number of accumulation layers formed in a depth direction in each mesa portion 19 of the diode section 80 may be less than the number of accumulation layers formed in the depth direction in each mesa portion 19 of the transistor section 70. This can easily make the integrated concentration of one or more accumulation layers in each mesa portion 19 of the diode section 80 smaller than the integrated concentration of one or more accumulation layers in each mesa portion 19 of the transistor section 70.

The accumulation layer of the diode section 80 may be provided at the same depth position as any accumulation layer of the transistor section 70. The depth position of each layer may be the peak position in the doping concentration distribution of the layer. In the present example, the first accumulation layer 62 of the transistor section 70 is provided at the same depth position as the first accumulation layer 62 of the diode section 80. Note that, when provided at the same depth position, that may have a predetermined error. For example, even if the position of the peak has an error within 10% of the half width of the mountain shaped doping concentration distribution including the peak, it may be regarded as the same depth position. By forming the respective layers at the same depth position, it becomes easy to simplify the manufacturing process.

Also, the doping concentration of the accumulation layer of the diode section 80 may be equal to a doping concentration of an accumulation layer provided at the same depth in the transistor section 70. Here, the doping concentration may be the peak value of the doping concentration in the layer. In the present example, the doping concentration D4 of the first accumulation layer 62 is equal to the doping concentration D1 of the first accumulation layer 62. Note that, when one doping concentration is equal to another one, that may have a predetermined error. For example, even if the doping concentrations have an error within 10%, it can be said that the doping concentrations are the same.

In this manner, by making the depth position and the doping concentration of the accumulation layer of the diode section 80 the same as that of any accumulation layer of the transistor section 70, the accumulation layer of the diode section 80 can be formed in the same manufacturing process as the accumulation layer of the transistor section 70. Thus, the manufacturing process can be simplified.

The doping concentration of any accumulation layer that is among the plurality of accumulation layers 60 in each mesa portion 19 of the transistor section 70 may be higher than the doping concentrations of the other accumulation layers formed at different depth positions. In the transistor section 70 of the present example, the doping concentration D3 of the third accumulation layer 66 provided at the deepest position is higher than any doping concentration (D1, D2) of the other accumulation layers of the transistor section 70. The doping concentration D3 may be greater than or equal to approximately three times the doping concentration D1, and less than or equal to approximately seven times the doping concentration D1. The doping concentrations D1 and D2 may be the same.

Note that, in the plurality of accumulation layers 60 in each mesa portion 19 of the transistor section 70, the plurality of doping concentrations Dv may become lower as being deeper from the upper surface 92. The doping concentration Dv corresponds to the valley of the doping concentration distribution with respect to the peak concentrations D1, D2, and D3. By the concentration of valleys of the plurality of doping concentrations becoming lower with respect to the depth direction, the capacitance between the gate and the collector can be adjusted to a predetermined magnitude.

As one example, the peak positions of the doping concentrations of the respective accumulation layers are arranged at equal intervals in the depth direction. In another example, the peak positions of the doping concentrations of the respective accumulation layers may be arranged at unequal intervals in the depth direction. Note that, by providing a plurality of accumulation layers 60 in the transistor section 70, the transient capacitance when turning on between the gate conductive portion 44 and the collector electrode 24 can be increased. Thereby, the turn-on loss can be reduced while improving the trade-off between the ON voltage and the turn-off loss in the transistor section 70.

The diode section 80 may not have an accumulation layer corresponding to the layer having the highest doping concentration among the plurality of accumulation layers 60 of the transistor section 70. In this manner, the integrated concentration of the accumulation layer of the diode section 80 can be made sufficiently lower than the integrated concentration of the accumulation layer in the transistor section 70. The diode section 80 of the present example has an accumulation layer positioned at the same depth as the first accumulation layer 62 provided at the shallowest position in the transistor section 70. Note that, the diode section 80 of the present example has neither an accumulation layer positioned at the same depth as the second accumulation layer 64 in the transistor section 70 nor an accumulation layer positioned at the same depth as the third accumulation layer 66 provided at the deepest position in the transistor section 70.

If three or more accumulation layers of the diode section 80 are formed, the plurality of doping concentrations Dv may become lower as being deeper from the upper surface 92. If three or more accumulation layers are formed, the plurality of doping concentrations Dv may become lower as being deeper from the upper surface 92.

FIG. 17 is a diagram showing another example of a doping concentration distribution according to the a-a cross section and the b-b cross section in FIG. 15B. In the present example, the doping concentration distribution in the transistor section 70 is the same as the example of FIG. 16.

The diode section 80 of the present example also has one high concentration layer 68 in each mesa portion 19. That is, between the base region 14 and the drift layer 18, the N-type doping concentration distribution having a higher concentration than the drift layer 18 has one peak. Note that, the high concentration layer 68 of the present example is formed in a longer range in the depth direction than any accumulation layer. The doping concentration D4 of the high concentration layer 68 is set so that the integrated concentration of the high concentration layer 68 becomes lower than the integrated concentration of one or more accumulation layers in the transistor section 70. In the present example, the doping concentration D4 of the high concentration layer 68 may be lower than the doping concentration D1 of the first accumulation layer 62, and may also be higher than the doping concentration D1 of the first accumulation layer 62.

With the configuration of the present example as well, the reverse recovery characteristic can be improved while suppressing deterioration of the ON voltage-OFF loss characteristic in the transistor section 70. Also, deterioration of trade-off between the switching loss and the ON loss at the time of reverse recovery with respect to the forward voltage in the diode section 80 can be suppressed.

FIG. 18 is a perspective view of the A-A cross section according to a fifth embodiment. In the transistor section 70 of the present example, the first distance $W_E$ between the two dummy trench portions 30 in the X-axis direction is larger than the second distance $W_M$ between the dummy trench portion 30 and the gate trench portion 40 in the X-axis direction. That is, the length in the X-axis direction of the mesa portion 19-2 is larger than the length in the X-axis direction of the mesa portion 19-1. The present example is different from the first to fourth embodiments described above in this point.

In the present example, the first distance $W_E$ is the distance between the side walls of the dummy trench 33 that face each other in the X-axis direction. Also, in the present example, the second distance $W_M$ is the distance between the side wall of the dummy trench 33 and the side wall of the gate trench 43 that face each other in the X-axis direction. In the present example, by making the first distance $W_E$ larger than the second distance $W_M$, carriers can be extracted efficiently from the contact region 15 between the respective dummy trench portions 30 when turning off. This can reduce Eoff.

In the present embodiment, while decreasing the second distance $W_M$ compared to other embodiments, the first distance $W_E$ is made greater. In the present embodiment, while the total of the distances between the trenches (that is, the total of the lengths of the mesa portions 19 in the X-axis direction) is constant, the distance between the two dummy trench portions 30 can be increased and between the dummy trench portion 30 and the gate trench portion 40 can be made smaller. In the present embodiment, the gate charge (that is, the charge Qg between the gate and the emitter) when turning on does not increase compared to the first to fourth embodiments. Also in the present example, trade-off of Von and Eoff can be improved. Note that, the present example and one or more of the first to fourth embodiments may be combined.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
a semiconductor substrate including a transistor region, wherein in the transistor region, the semiconductor substrate includes:
  a plurality of trench portions extending in a predetermined direction,
  a mesa portion each provided between two adjacent trench portions in the plurality of trench portions, and
  a drift layer of a first conductivity type provided below the mesa portion,
wherein the plurality of trench portions include:
  a gate trench portion having a gate conductive portion, to which a gate potential is supplied, and
  a plurality of dummy trench portions, each having a dummy trench conductive portion, to which an emitter potential is supplied,
wherein the mesa portion comprises:
  an emitter region of the first conductivity type having a higher doping concentration than the drift layer, the emitter region being at least partially positioned on an upper surface of the semiconductor substrate,
  a contact region of a second conductivity type being at least partially positioned on an upper surface of the semiconductor substrate, and
  one or more accumulation layers being provided below the emitter region and the contact region, the one or more accumulation layers having a higher doping concentration of the first conductivity type than the drift layer,
wherein a number of the one or more accumulation layers provided in a depth direction from the upper surface to a lower surface of the semiconductor substrate in the mesa portion adjacent to the gate trench portion is larger than the number of the one or more accumulation layers provided in the depth direction in the mesa portion between two dummy trench portions among the plurality of dummy trench portions.

2. The semiconductor device according to claim 1, wherein
no accumulation layer is provided in the mesa portion between the two dummy trench portions.

3. The semiconductor device according to claim 1, wherein
one accumulation layer is provided in the mesa portion between the two dummy trench portions.

4. The semiconductor device according to claim 1, wherein
the emitter region and the contact region are alternately provided in the predetermined direction,
the mesa portion adjacent to the gate trench portion has a plurality of accumulation layers,
at least one accumulation layer among the plurality of accumulation layers is provided below at least a part of the emitter region, but is not provided below a partial region of the contact region.

5. The semiconductor device according to claim 4, wherein
the at least one accumulation layer is an island-like accumulation layer including a plurality of accumulation regions having a higher doping concentration of the first conductivity type than the drift layer, the plurality of accumulation regions each provided in a discrete manner in a plane orthogonal to the depth direction,
each of the plurality of accumulation regions is provided below at least a part of the emitter region, but is not provided below a partial region of the contact region and is spaced apart,
all the accumulation layers other than the accumulation layer closest to the upper surface in the depth direction are the island-like accumulation layers.

6. The semiconductor device according to claim 5, wherein
the mesa portion further has a base region having a lower doping concentration of the second conductivity type than the contact region,
the emitter region has a bottom region being, in the semiconductor substrate, not in direct contact with the contact region, and being in direct contact with the base region,
a length of each of the plurality of accumulation regions in the predetermined direction is longer than a length of the bottom region in the predetermined direction.

7. The semiconductor device according to claim 5, wherein
the mesa portion further has a base region having a lower doping concentration of the second conductivity type than the contact region,
the emitter region has a bottom region being, in the semiconductor substrate, not in direct contact with the contact region, and being in direct contact with the base region,
a length of each of the plurality of accumulation regions in the predetermined direction is shorter than a length of the bottom region in the predetermined direction.

8. The semiconductor device according to claim 6, wherein
when a length of each of the plurality of accumulation regions in the predetermined direction is $L_{CHS}$, and a length of the bottom region in the predetermined direction of the emitter region is $L_0$, the $L_{CHS}$ and the $L_0$ satisfy $0.5 \leq L_{CHS}/L_0 \leq 2$.

9. The semiconductor device according to claim 1, wherein
in the transistor region, a first distance between the two dummy trench portions in a direction orthogonal to the predetermined direction is larger than a second distance between a dummy trench portion among the plurality of dummy trench portions and the gate trench portion in a direction orthogonal to the predetermined direction.

* * * * *